(12) United States Patent
Kwon

(10) Patent No.: US 11,658,090 B2
(45) Date of Patent: May 23, 2023

(54) SEMICONDUCTOR PACKAGE SYSTEM

(71) Applicant: Samsung Electronics Co., Ltd., Suwon-si (KR)

(72) Inventor: Heungkyu Kwon, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 66 days.

(21) Appl. No.: 17/232,495

(22) Filed: Apr. 16, 2021

(65) Prior Publication Data

US 2021/0233827 A1 Jul. 29, 2021

Related U.S. Application Data

(63) Continuation of application No. 16/390,585, filed on Apr. 22, 2019, now Pat. No. 10,991,638.

(30) Foreign Application Priority Data

| May 14, 2018 | (KR) | .................. | 10-2018-0055079 |
| May 14, 2018 | (KR) | .................. | 10-2018-0055081 |
| Sep. 14, 2018 | (KR) | .................. | 10-2018-0110518 |

(51) Int. Cl.
*H01L 23/31* (2006.01)
*H01L 23/373* (2006.01)
(Continued)

(52) U.S. Cl.
CPC ...... *H01L 23/3675* (2013.01); *H01L 23/3128* (2013.01); *H01L 23/3735* (2013.01); *H01L 25/16* (2013.01)

(58) Field of Classification Search
CPC ............ H01L 23/3675; H01L 23/3128; H01L 23/3735; H01L 23/544; H01L 23/10;
(Continued)

(56) References Cited

U.S. PATENT DOCUMENTS 6,222,259 B1 4/2001 Park et al.
6,867,502 B2 3/2005 Katagiri et al.
(Continued)

FOREIGN PATENT DOCUMENTS

JP H06224334 A 8/1994
JP 2003-264256 A 9/2003
(Continued)

OTHER PUBLICATIONS

Notice of Allowance dated Dec. 23, 2020, issued in corresponding U.S. Appl. No. 16/390,585.

*Primary Examiner* — Omar F Mojaddedi
(74) *Attorney, Agent, or Firm* — Harness, Dickey & Pierce, P.L.C.

(57) ABSTRACT

A semiconductor package system includes a substrate, a first and a second semiconductor package, a first thermal conductive layer, a first passive device, and a heat radiation structure. The first and second semiconductor package and first passive device may be mounted on a top surface of the substrate. The first semiconductor package may include a first semiconductor chip that includes a plurality of logic circuits. The first thermal conductive layer may be on the first semiconductor package. The heat radiation structure may be on the first thermal conductive layer, the second semiconductor package, and the first passive device. The heat radiation structure may include a first bottom surface physically contacting the first thermal conductive layer, and a second bottom surface at a higher level than that of the first bottom surface. The second bottom surface may be on the second semiconductor package and/or the first passive device.

20 Claims, 22 Drawing Sheets

(51) Int. Cl.
*H01L 23/367* (2006.01)
*H01L 23/433* (2006.01)
*H01L 23/498* (2006.01)
*H01L 25/16* (2023.01)

(58) Field of Classification Search
CPC .......... H01L 23/3171; H01L 23/49816; H01L 23/3737; H01L 23/552; H01L 23/433; H01L 23/367; H01L 25/16; H01L 25/105; H01L 25/115; H01L 24/13; H01L 24/16; H01L 24/19; H01L 24/20; H01L 24/83; H01L 24/48; H01L 24/29; H01L 24/32
See application file for complete search history.

(56) References Cited

U.S. PATENT DOCUMENTS

| | | |
|---|---|---|
| 7,141,819 B2 | 11/2006 | Maruko |
| 7,250,676 B2 | 7/2007 | Wang |
| 7,687,803 B2 | 3/2010 | Takagi et al. |
| 7,745,915 B2 | 6/2010 | Suwa et al. |
| 8,541,876 B2 | 9/2013 | Lu et al. |
| 8,780,561 B2 | 7/2014 | Danello et al. |
| 8,981,554 B2 | 3/2015 | Kim |
| 9,460,982 B2 | 10/2016 | Kourakata et al. |
| 9,595,506 B2 | 3/2017 | Chen et al. |
| 9,595,514 B2 | 3/2017 | Bruno et al. |
| 9,735,082 B2 | 8/2017 | Hung et al. |
| 2002/0121683 A1 | 9/2002 | Kelly et al. |
| 2005/0189634 A1 | 9/2005 | Wakiyama et al. |
| 2008/0054261 A1 | 3/2008 | Song et al. |
| 2008/0105964 A1 | 5/2008 | Iwamura et al. |
| 2008/0211088 A1 | 9/2008 | Sato |
| 2009/0065773 A1 | 3/2009 | Ishikawa et al. |
| 2009/0115044 A1 | 5/2009 | Hoshino et al. |
| 2010/0109152 A1 | 5/2010 | Kariyazaki |
| 2011/0228485 A1* | 9/2011 | Usui ............... H05K 7/20509 361/720 |
| 2012/0051017 A1 | 3/2012 | Lee et al. |
| 2014/0340849 A1* | 11/2014 | Kim ................ H01L 23/36 361/717 |
| 2015/0162307 A1* | 6/2015 | Chen ................ H01L 23/04 438/107 |
| 2015/0303174 A1 | 10/2015 | Yu et al. |
| 2016/0120039 A1 | 4/2016 | Bang et al. |
| 2016/0233141 A1* | 8/2016 | Hirobe ............... H01L 24/17 |
| 2016/0320426 A1 | 11/2016 | Boysel et al. |
| 2017/0141095 A1 | 5/2017 | Bruno et al. |
| 2017/0170147 A1 | 6/2017 | Goh et al. |
| 2017/0345732 A1 | 11/2017 | Hung et al. |
| 2018/0374776 A1* | 12/2018 | Liu ................ H01L 23/3737 |
| 2019/0259695 A1* | 8/2019 | Gandhi ............... H01L 23/642 |

FOREIGN PATENT DOCUMENTS

| | | |
|---|---|---|
| JP | 3573135 A | 9/2003 |
| JP | 2004-022664 A | 1/2004 |
| JP | 3811467 A | 12/2004 |
| JP | 2006-237385 A | 9/2006 |
| JP | 2006-278374 A | 10/2006 |
| JP | 20060344824 A | 12/2006 |
| JP | 2008-124080 A | 5/2008 |
| JP | 2008-277362 A | 11/2008 |
| JP | 2008305838 A | 12/2008 |
| JP | 2009-049170 A | 3/2009 |
| JP | 2009-070965 A | 4/2009 |
| JP | 5246133 A | 5/2011 |
| JP | 2014154688 A | 8/2014 |
| KR | 20-2000-0019563 U | 11/2000 |
| KR | 10-2003-0074158 A | 9/2003 |
| KR | 10-2006-0094917 A | 8/2006 |
| KR | 10-0853136 A | 12/2006 |
| KR | 10-0843202 A | 3/2008 |
| KR | 10-2008-0041999 A | 5/2008 |
| KR | 10-2009-0027573 A | 3/2009 |
| KR | 10-2016-0091084 A | 8/2016 |
| WO | WO-9916128 A1 | 4/1999 |

\* cited by examiner

SEMICONDUCTOR PACKAGE SYSTEM

CROSS-REFERENCE TO RELATED APPLICATION

This U.S. nonprovisional application is a continuation of U.S. application Ser. No. 16/390,585, filed Apr. 22, 2019, which claims priority to Korean Patent Application Nos. 10-2018-0055079 (filed on May 14, 2018), 10-2018-0055081 (filed on May 14, 2018), and 10-2018-0110518 (filed on Sep. 14, 2018) in the Korean Intellectual Property Office. The entire contents of each of the above-referenced applications are hereby incorporated by reference.

BACKGROUND

Inventive concepts relate to a semiconductor package system, and more particularly, to a semiconductor package system provided with a heat radiation structure.

A semiconductor package may be provided to implement an integrated circuit chip to qualify for use in electronic products. The higher speed and capacity of the semiconductor package, the more increase in power consumption of the semiconductor package. Thermal characteristics are increasingly regarded as an importance feature in a semiconductor package.

SUMMARY

Some example embodiments of inventive concepts provide a package system with improved thermal characteristics and a semiconductor module including the same.

According to some example embodiments of inventive concepts, a semiconductor package system may include: a substrate; a first semiconductor package mounted on a top surface of the substrate, the first semiconductor package including a first semiconductor chip, the first semiconductor chip including a plurality of logic circuits; a first thermal conductive layer on the first semiconductor package; a second semiconductor package mounted on the top surface of the substrate; a first passive device mounted on the top surface of the substrate; and a heat radiation structure on the first thermal conductive layer, the second semiconductor package, and the first passive device. The heat radiation structure may include a first bottom surface and a second bottom surface. The first bottom surface may physically contact the first thermal conductive layer, and a level of the second bottom surface may be higher than a level of the first bottom surface. The second bottom surface may be provided on the second semiconductor package, the first passive device, or both the second semiconductor package and the first passive device.

According to some example embodiments of inventive concepts, a semiconductor package system may include: a substrate; a first semiconductor package mounted on the substrate; a second semiconductor package mounted on the substrate; a passive device mounted on the substrate; a heat radiation structure on the first semiconductor package, the second semiconductor package, and the passive device; and a plurality of thermal conductive layers physically contacting the heat radiation structure. A first bottom surface of the heat radiation structure may include a trench. When viewed in plan, the trench may overlap one or more of the second semiconductor package and the passive device. The thermal conductive layers may include a first thermal conductive layer on a top surface of the first semiconductor package. The first thermal conductive layer may be thinner than any other thermal conductive layer among the plurality of thermal conductive layers.

According to some example embodiments of inventive concepts, a semiconductor package system may include: a substrate; a first semiconductor package mounted on the substrate; a passive device mounted on the substrate; a heat radiation structure on the first semiconductor package and the passive device; and a first thermal conductive layer between the first semiconductor package and the heat radiation structure. A height of the passive device may be the same as or greater than a sum of a height of the first semiconductor package and a height of the first thermal conductive layer. The heat radiation structure may include a first bottom surface and a second bottom surface. The first bottom surface may physically contact the first thermal conductive layer, and the second bottom surface may be at a higher level than a level of the first bottom surface. The second bottom surface of the heat radiation structure may be on the passive device.

DETAILED DESCRIPTION

Figure 1A:
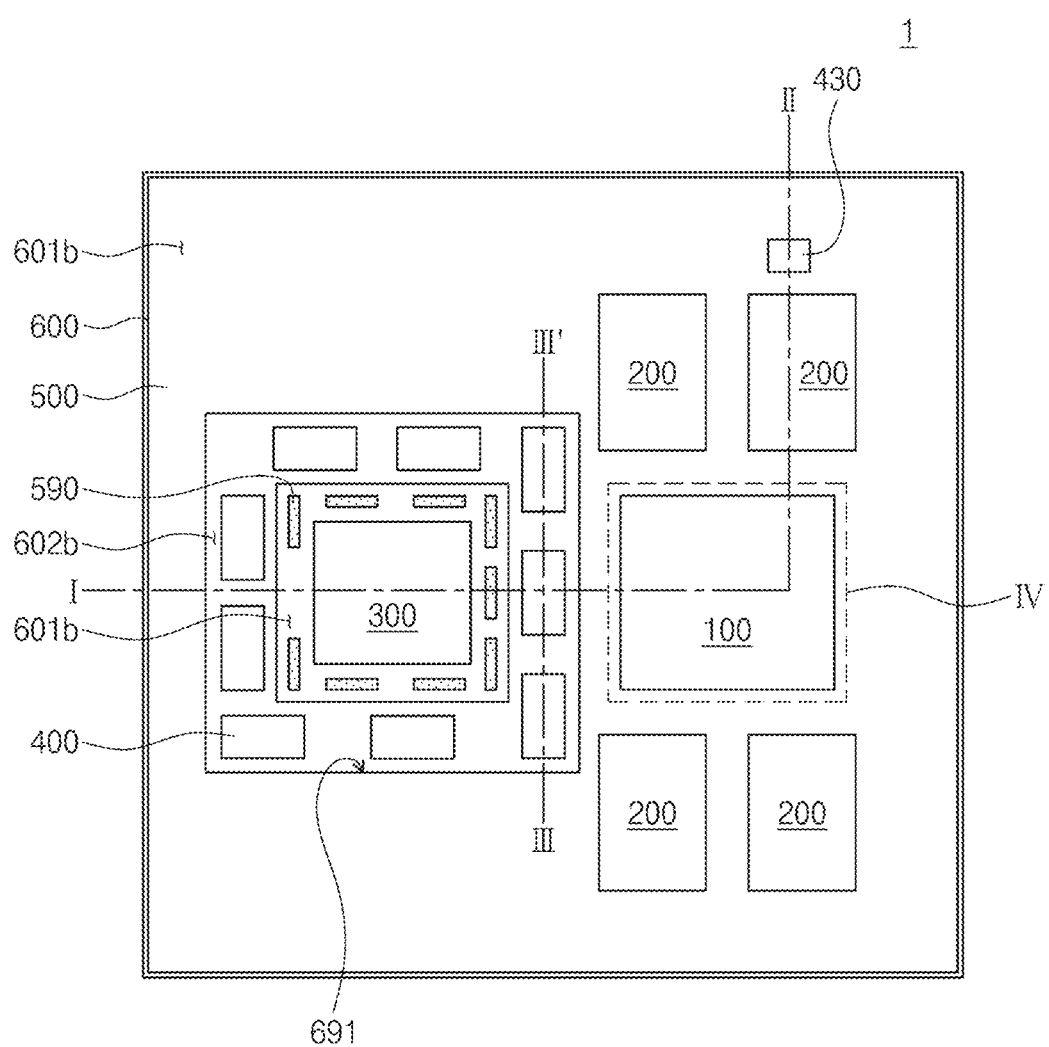
FIG. 1A illustrates a plan view showing a package system according to some example embodiments.

In this description, like reference numerals may indicate like components. The following will now describe a package system and a semiconductor module including the same according to inventive concepts. In the following description, a semiconductor package system may be a package system or a semiconductor module including the package system.

Figure 1B:
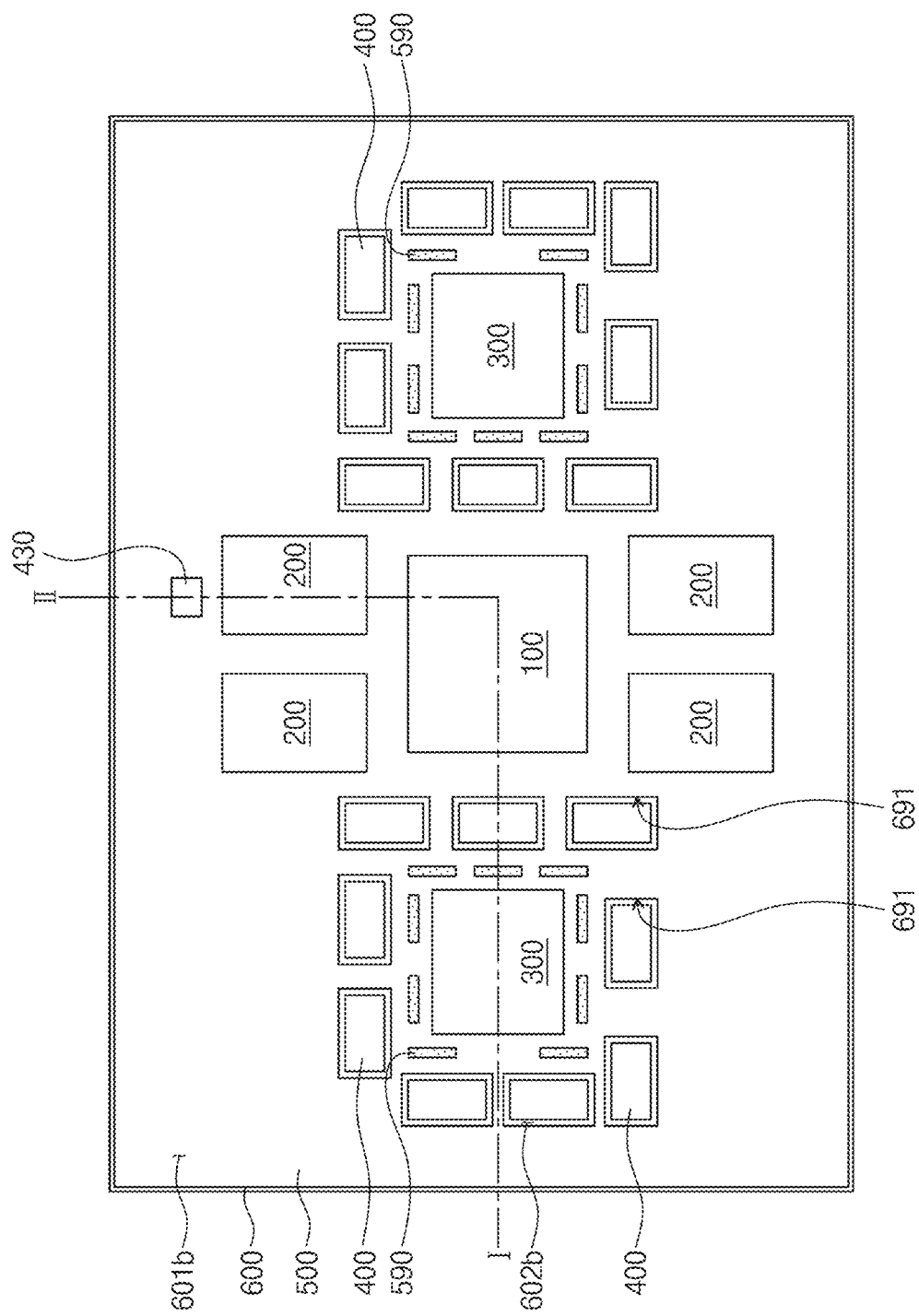
FIG. 1B illustrates a plan view showing a package system according to some example embodiments.
Figure 1C:
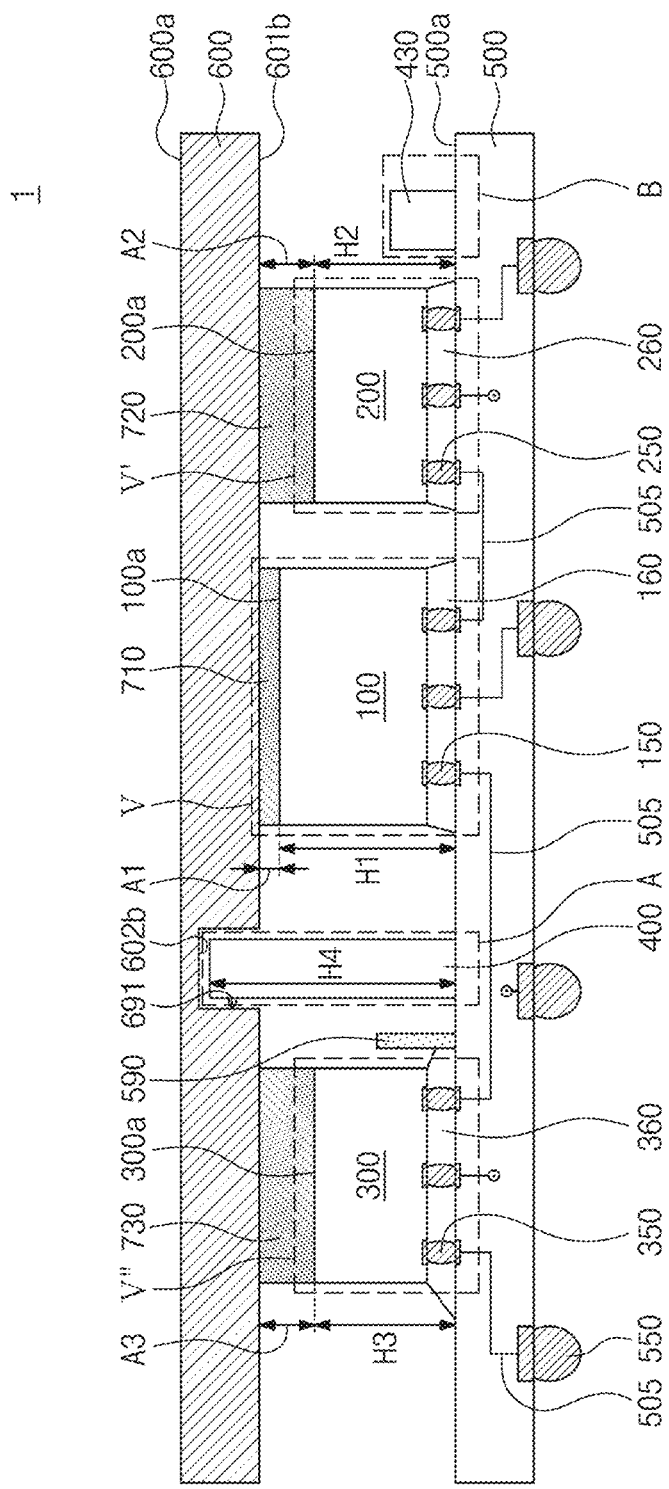
FIG. 1C illustrates a cross-sectional view taken along line I-II of FIG. 1A.
Figure 1D:
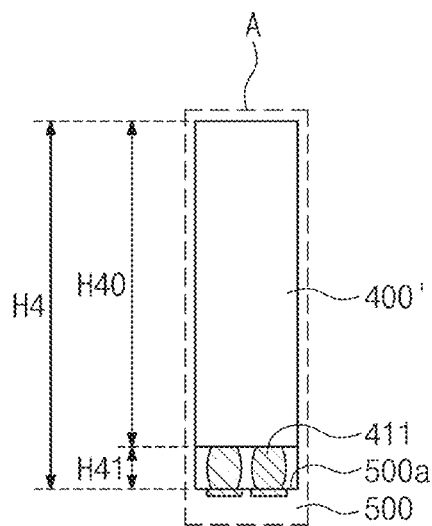
FIG. 1D illustrates an enlarged view of section A in FIG. 1C.
Figure 1E:
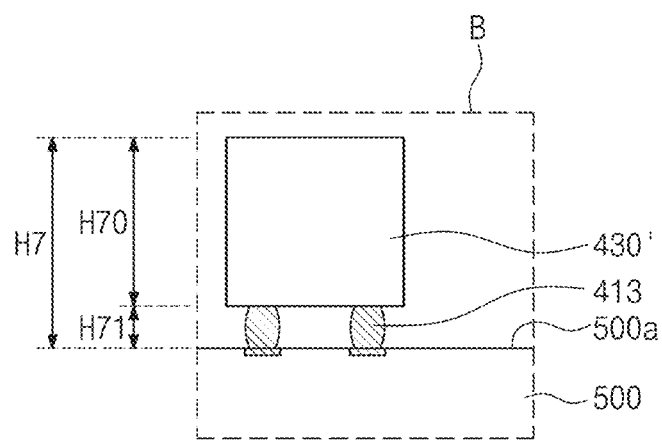
FIG. 1E illustrates an enlarged view of section B in FIG. 1C.
Figure 1F:
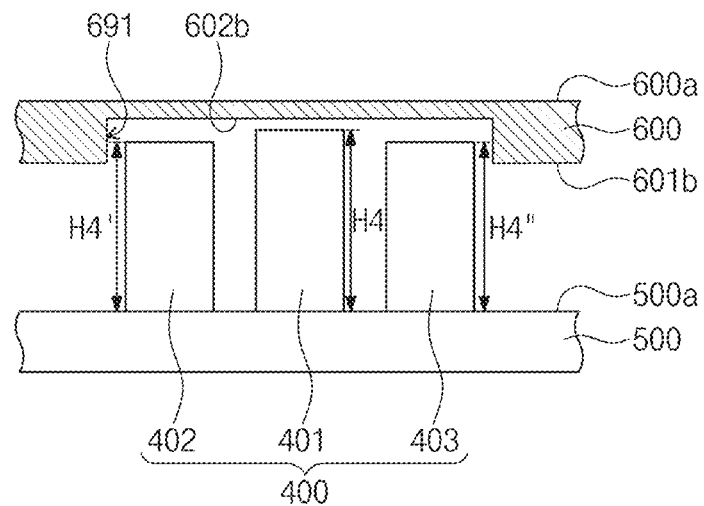
FIG. 1F illustrates a cross-sectional view taken along line III-III' of FIG. 1A.

FIG. 1A illustrates a plan view showing a package system according to some example embodiments. FIG. 1B illustrates a plan view showing a package system according to some example embodiments. FIG. 1C illustrates a cross-sectional view taken along line I-II of FIG. 1A. FIG. 1D illustrates an enlarged view of section A in FIG. 1C. FIG. 1E illustrates an enlarged view of section B in FIG. 1C. FIG. 1F illustrates a cross-sectional view taken along line III-III' of FIG. 1A.

Referring to FIGS. 1A, 1B, 1C, and 1D, a package system 1 may include a substrate 500, a first semiconductor package 100, a second semiconductor package 200, a third semiconductor package 300, a first passive device 400, a heat radiation structure 600, and a first thermal conductive layer 710. For example, a printed circuit board (PCB) having a circuit pattern may be used as the substrate 500. Conductive terminals 550 may be provided on a bottom surface of the substrate 500. The conductive terminals 550 may include one or more of a solder ball, a bump, and a pillar. The conductive terminals 550 may include metal.

The first semiconductor package 100 may be mounted on a top surface 500a of the substrate 500. The first semiconductor package 100 may include a system-on-chip or a logic chip, as will be discussed below. First connection terminals 150 may be interposed between the substrate 500 and the first semiconductor package 100. The first semiconductor package 100 may be electrically connected through the first connection terminals 150 to the substrate 500. In this description, the phrase "electrically connected/coupled to the substrate 500" may mean "electrically connected/coupled to wiring lines 505 in the substrate 500." The first connection terminals 150 may include a solder ball, a pillar, a bump, or a ball grid array. The first semiconductor package 100 mounted on the substrate 500 may have a height H1 that is defined to include a height of the first connection terminal 150.

The second semiconductor package 200 may be mounted on the top surface 500a of the substrate 500. When viewed in plan, the second semiconductor package 200 may be disposed spaced apart from the first semiconductor package 100. The second semiconductor package 200 may be of a different type from the first semiconductor package 100. Second connection terminals 250 may be interposed between the substrate 500 and the second semiconductor package 200. The second semiconductor package 200 may be electrically connected through the second connection terminals 250 to the substrate 500. The second connection terminals 250 may include a solder ball, a pillar, a bump, or a ball grid array. The second semiconductor package 200 mounted on the substrate 500 may have a height H2 that includes a height of the second connection terminal 250. The height H1 of the mounted first semiconductor package 100 may be greater than the height H2 of the mounted second semiconductor package 200. For example, the first semiconductor package 100 may have a top surface 100a at a higher level than that of a top surface 200a of the second semiconductor package 200. The second semiconductor package 200 may be provided in plural.

The third semiconductor package 300 may be mounted on the top surface 500a of the substrate 500. When viewed in plan, the third semiconductor package 300 may be disposed spaced apart from the first and second semiconductor packages 100 and 200. The third semiconductor package 300 may be of a different type from the first and second semiconductor packages 100 and 200. The third semiconductor package 300 may be provided in single as shown in FIG. 1A. For another example, the third semiconductor package 300 may be provided in plural as shown in FIG. 1B. In this case, the third semiconductor packages 300 may be disposed spaced apart from each other. The number and planar arrangement of the third semiconductor packages 300 may be variously changed. As shown in FIG. 1C, third connection terminals 350 may be interposed between the substrate 500 and the third semiconductor package 300. The third semiconductor package 300 may be electrically connected through the third connection terminals 350 to the substrate 500. The third connection terminals 350 may include a solder ball, a pillar, a bump, or a ball grid array. The third semiconductor package 300 mounted on the substrate 500 may have a height H3 that includes a height of the third connection terminal 350. The height H1 of the mounted first semiconductor package 100 may be greater than the height H3 of the mounted third semiconductor package 300. For example, the top surface 100a of the first semiconductor package 100 may be located at a higher level than that of a top surface 300a of the third semiconductor package 300.

The first semiconductor package 100 may be electrically connected through the wiring lines 505 of the substrate 500 to the second and third semiconductor packages 200 and 300 and to the conductive terminals 550. The second semiconductor package 200 may be electrically connected through the substrate 500 to the first and third semiconductor packages 100 and 300 and to the conductive terminals 550. The third semiconductor package 300 may be electrically connected through the substrate 500 to the first and second semiconductor packages 100 and 200 and to the conductive terminals 550.

The first passive device 400 may be mounted on the top surface 500a of the substrate 500. When viewed in plan, the first passive device 400 may be disposed spaced apart from the first, second, and third semiconductor packages 100, 200, and 300. The first passive device 400 may include one or more of an inductor, a resistor, and a capacitor. As shown in FIG. 1D, first connectors 411 may further be provided between the substrate 500 and the first passive device 400. In this case, the first passive device 400 mounted on the substrate 500 may have a height H4 that is defined to include a height H41 of the first connector 411. For example, the height H4 of the mounted first passive device 400 may be the same as a sum of the height H41 of the first connector 411 and a height H40 of the first passive device 400' before mounted on the substrate 500. The first connectors 411 may include a solder ball, a pillar, or a bump. In figures other than FIG. 1D, the first connectors 411 are not illustrated for the purpose of brevity, but inventive concepts are not limited thereto.

The heat radiation structure 600 may be provided on the first, second, and third semiconductor packages 100, 200, and 300 and on the first passive device 400. The heat radiation structure 600 may be spaced apart from the substrate 500. The heat radiation structure 600 may have a top surface 600a and a first bottom surface 601b facing each other. The first bottom surface 601b of the heat radiation structure 600 may be parallel to the top surface 500a of the substrate 500. The first bottom surface 601b of the heat radiation structure 600 may be provided on the first semiconductor package 100, the second semiconductor package 200, and the third semiconductor package 300. The heat radiation structure 600 may include a thermal conductive material. The thermal conductive material may include a metallic material (e.g., copper and/or aluminum) or a carbon-containing material (e.g., graphene, graphite, and/or carbon nano-tube). The heat radiation structure 600 may have a relatively high thermal conductivity. For example, a single metal layer or a plurality of stacked metal layers may be used as the heat radiation structure 600. For another example, the heat radiation structure 600 may include a heat sink or a heat pipe. For another example, the heat radiation structure 600 may be configured to use water cooling.

The first thermal conductive layer 710 may be interposed between the first semiconductor package 100 and the heat radiation structure 600. The first thermal conductive layer 710 may physically contact the top surface 100a of the first semiconductor package 100 and the first bottom surface 601b of the heat radiation structure 600. The first thermal conductive layer 710 may include a thermal interface material (TIM). The thermal interface material may include, for example, a polymer and thermal conductive particles. The thermal conductive particles may be distributed in the polymer. When the first semiconductor package 100 is operated, heat generated from the first semiconductor package 100 may be outwardly discharged through the first thermal conductive layer 710 and the heat radiation structure 600.

A second thermal conductive layer 720 may be provided between the second semiconductor package 200 and the heat radiation structure 600. The second thermal conductive layer 720 may physically contact the top surface 200a of the second semiconductor package 200 and the first bottom surface 601b of the heat radiation structure 600. The second thermal conductive layer 720 may include, for example, a thermal interface material (TIM). When the second semiconductor package 200 is operated, heat generated from the second semiconductor package 200 may be transmitted through the second thermal conductive layer 720 to the heat radiation structure 600.

A third thermal conductive layer 730 may be provided between the third semiconductor package 300 and the heat radiation structure 600. The third thermal conductive layer 730 may physically contact the top surface 300a of the third semiconductor package 300 and the first bottom surface 601b of the heat radiation structure 600. The third thermal conductive layer 730 may include, for example, a thermal interface material (TIM). When the third semiconductor package 300 is operated, heat generated from the third semiconductor package 300 may be transmitted through the third thermal conductive layer 730 to the heat radiation structure 600.

When the package system 1 is operated, the first semiconductor package 100 may generate a large amount of heat. For example, the amount of heat generated from the first semiconductor package 100 may be greater than those from the second semiconductor package 200, the third semiconductor package 300, and the first passive device 400. Thermal characteristics of the first semiconductor package 100 may have a greater influence on operating performance of the package system 1 than thermal characteristics of the second and third semiconductor packages 200 and 300. The more enhanced are thermal characteristics of the first semiconductor package 100, the more improved are operating characteristics of the package system 1. Each of the first, second, and third thermal conductive layers 710, 720, and 730 may have a lower thermal conductivity than that of the heat radiation structure 600. As a height A1 of the first thermal conductive layer 710 becomes reduced, heat generated from the first semiconductor package 100 may be discharged at higher rates. In certain embodiments, the height A1 of the first thermal conductive layer 710 may be the smallest one of heights of thermal conductive layers in contact with a bottom surface (e.g., the first bottom surface 601b) of the heat radiation structure 600. In this case, the heat conductive layers may include the first, second, and third thermal conductive layers 710, 720, and 730. For another example, the thermal conductive layers may further include adhesive patterns 741 and 742 which will be discussed with reference to FIGS. 2A and 2B. The height A1 of the first thermal conductive layer 710 may be less than a height A2 of the second thermal conductive layer 720 and a height A3 of the third thermal conductive layer 730. Therefore, heat generated from the first semiconductor package 100 may be promptly transmitted to the heat radiation structure 600. In conclusion, the package system 1 may improve in operating characteristics.

The heat radiation structure 600 may have a trench. The trench may extend from the first bottom surface 601b toward the top surface 600a of the heat radiation structure 600. When viewed in plan, the trench may overlap one or more of the first passive device 400, the second semiconductor package 200, and the third semiconductor package 300. In certain embodiments, the trench may be a first trench 691 provided on the first bottom surface 601b of the heat radiation structure 600. The first trench 691 may cause the heat radiation structure 600 to have a second bottom surface 602b. The second bottom surface 602b of the heat radiation structure 600 may correspond to a bottom surface of the first trench 691. The second bottom surface 602b may be located at a higher level than that of the first bottom surface 601b and at a lower level than that of the top surface 600a. The second bottom surface 602b of the heat radiation structure 600 may be provided above the first passive device 400, and when viewed in plan, may overlap the first passive device 400. The second bottom surface 602b of the heat radiation structure 600 may face a top surface of the first passive device 400. The top surface of the first passive device 400 may be located at a level the same as or lower than that of the second bottom surface 602b.

In certain embodiments, the height H4 of the mounted first passive device 400 may be the same as or greater than a sum of the height H1 of the mounted first semiconductor package 100 and the height A1 of the first thermal conductive layer 710. The top surface of the first passive device 400 may be located at a level the same as or higher than that of a top surface of the first thermal conductive layer 710. In case that the heat radiation structure 600 has no first trench 691, the first passive device 400 mounted on the substrate 500 may increase a distance between the top surface 500a of the substrate 500 and the first bottom surface 601b of the heat radiation structure 600. This case may increase the height A1 of the first thermal conductive layer 710, the height A2 of the second thermal conductive layer 720, and the height A3 of the third thermal conductive layer 730. In certain embodiments, when viewed in plan as shown in FIG. 1A, the first trench 691 may overlap the first passive device 400. Even though the first passive device 400 is mounted on the top surface 500a of the substrate 500, the height A1 of the first thermal conductive layer 710 may be relatively small. Therefore, the first semiconductor package 100 may improve in thermal characteristics. Likewise, the second and third semiconductor packages 200 and 300 may also improve in thermal characteristics. The level of the second bottom surface 602b of the heat radiation structure 600 may depend on the height H4 of the mounted first passive device 400.

The first passive device 400 may be provided in plural. The first passive devices 400 may be spaced apart from each other. As shown in FIGS. 1A and 1F, the first trench 691 may overlap a plurality of the first passive devices 400. The first passive devices 400 may include a first sub-passive device 401, a second sub-passive device 402, and a third sub-passive device 403. The first, second, and third sub-passive devices 401, 402, and 403 mounted on the substrate 500 may have their respective heights H4, H4', and H4" that are different from each other. For example, the height H4 of the mounted first sub-passive device 401 may be greater than the height H4' of the mounted second sub-passive device 402 and the height H4" of the mounted third sub-passive device 403. The height H4 of the mounted first sub-passive device 401 may be the same as or greater than the sum of the height H1 of the first semiconductor package 100 and the height A1 of the first thermal conductive layer 710. As viewed in plan, the first trench 691 may overlap the first, second, and third sub-passive devices 401, 402 and 403. The level of the second bottom surface 602b of the heat radiation structure 600 may depend on the greatest one of the heights H4, H4', and H4" respectively of the first, second, and third sub-passive devices 401, 402, and 403. For example, the second bottom surface 602b of the heat radiation structure 600 may be located at a level the same as or higher than that of a top surface of the first sub-passive device 401. As shown in FIG. 1B, the first trench 691 may be provided in plural. The first trenches 691 may overlap corresponding first passive devices 400. The following will describe a single first passive device 400 and a single first trench 691.

An electronic device 430 may further be mounted on the top surface 500a of the substrate 500. The electronic device 430 may include a real-time clock or an oscillator such as a crystal oscillator. As shown in FIG. 1E, conductive connection terminals 413 may further be provided between the electronic device 430 and the top surface 500a of the substrate 500, electrically connecting the electronic device 430 and the substrate 500 to each other. In this case, the electronic device 430 mounted on the substrate 500 may have a height H7 that is defined to include a height H71 of the conductive connection terminal 413. The height H7 of the mounted electronic device 430 may be the same as, for example, a sum of the height H71 of the conductive connection terminal 413 and a height H70 of the electronic device 430' before mounted on the substrate 500. The sum of the height H1 of the mounted first semiconductor package 100 and the height A1 of the first thermal conductive layer 710 may be greater than the height H7 of the mounted electronic device 430. The electronic device 430 may have a top surface at a level the same as or lower than that of the top surface of the first thermal conductive layer 710. Even though the electronic device 430 is provided on the top surface 500a of the substrate 500, heat generated from the first semiconductor package 100 may be discharged through the first thermal conductive layer 710 to the heat radiation structure 600. For another example, no electronic device 430 may be provided on the top surface 500a of the substrate 500. In figures other than FIG. 1E, the conductive connection terminals 413 are not illustrated for the purpose of brevity, but inventive concepts are not limited thereto.

A first under-fill layer 160 may be provided in a gap between the substrate 500 and the first semiconductor package 100, encapsulating the first connection terminals 150. A second under-fill layer 260 may be provided in a gap between the substrate 500 and the second semiconductor package 200, encapsulating the second connection terminals 250. A third under-fill layer 360 may be provided in a gap between the substrate 500 and the third semiconductor package 300, encapsulating the third connection terminals 350. The first, second, and third under-fill layers 160, 260, and 360 may include a dielectric polymer such as an epoxy polymer. The first, second, and third under-fill layers 160, 260, and 360 may improve joint reliability of the first, second, and third connection terminals 150, 250, and 350. Differently from that shown, one or more of the first, second, and third under-fill layers 160, 260, and 360 may not be provided.

A dam structure 590 may further be provided on the top surface 500a of the substrate 500. The dam structure 590 may be provided between the third semiconductor package 300 and the first passive device 400. Even though an under-fill material of the third under-fill layer 360 flows, the dam structure 590 may facilitate to mount the first passive device 400. The dam structure 590 may include a liquid resin. Although not shown, the substrate 500 may include a plurality of layers, and an uppermost one of the layers may include a dielectric polymer such as a solder resist material. For example, the dam structure 590 may be integrally formed with the uppermost layer of the substrate 500. In this case, the dam structure 590 and the uppermost layer of the substrate 500 may be connected without a boundary therebetween. In certain embodiments, the dam structure 590 may include a different material from that of the substrate 500. For example, the dam structure 590 may be formed of the same material as that of one of the first, second, and third under-fill layers 160, 260, and 360. The dam structure 590 may have a height the same as or less than the sum of the height H1 of the first semiconductor package 100 and the height A1 of the first thermal conductive layer 710.

The number and arrangement of the dam structure 590 may be variously changed. For example, the dam structure 590 may be provided in plural. For another example, the dam structure 590 may be disposed between the first semiconductor package 100 and the first passive device 400. For another example, the dam structure 590 may be disposed between the second semiconductor package 200 and the first passive device 400.

Figure 1G:
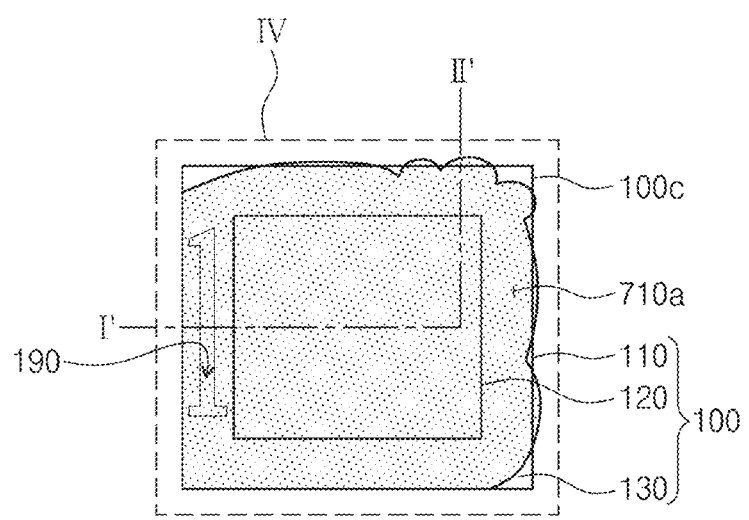
FIG. 1G illustrates a plan view showing a first semiconductor package according to some example embodiments.
Figure 1H:
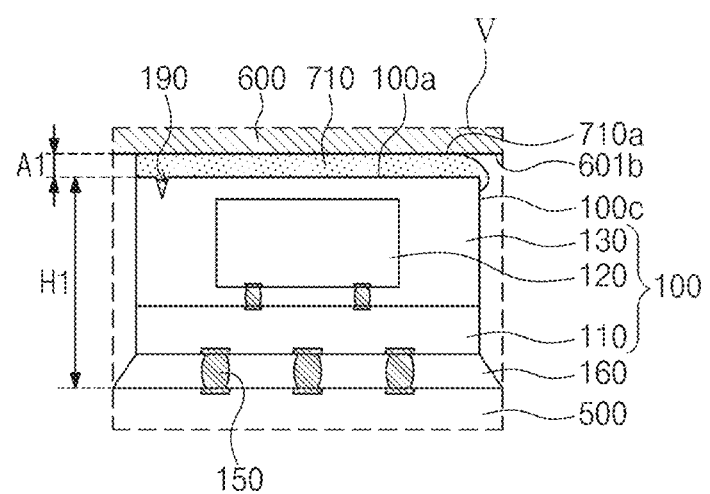
FIG. 1H illustrates a cross-sectional view taken along line I'-II' of FIG. 1G, showing an enlarged view of section V in FIG. 1C.

FIG. 1G illustrates an enlarged view of section IV in FIG. 1A, showing a first semiconductor package according to some example embodiments. FIG. 1H illustrates a cross-sectional view taken along line I'-II' of FIG. 1G, showing an enlarged view of section V in FIG. 1C.

Referring to FIGS. 1C, 1G, and 1H, the first semiconductor package 100 may include a first package substrate 110, a first semiconductor chip 120, and a first molding layer 130. For example, a printed circuit board (PCB) or a redistribution layer may be used as the first package substrate 110. The first semiconductor chip 120 may be flip-chip mounted on the first package substrate 110. Interposers may be provided between the first semiconductor chip 120 and the first package substrate 110. The interposers may include a solder ball, a pillar, or a ball grid array. The interposers may include a conductive material such as metal. The first semiconductor chip 120 may be a system-on-chip (SOC), a logic chip, or an application processor (AP). The first semiconductor chip 120 may include circuits having different functions. For example, the first semiconductor chip 120 may include a logic circuit and a memory circuit. The first semiconductor chip 120 may further include one or more of a digital integrated circuit (IC), a wireless radio frequency integrated circuit (RFIC), and an input/output circuit. Heat generation from the first semiconductor package 100 during its operation may mean heat generation from the first semiconductor chip 120.

The first molding layer 130 may be disposed on the first package substrate 110, encapsulating the first semiconductor chip 120. The first molding layer 130 may cover side and top surfaces of the first semiconductor chip 120. In this case, the top surface 100a of the first semiconductor package 100 may correspond to a top surface of the first molding layer 130. The first molding layer 130 may include a dielectric polymer such as an epoxy molding compound. The first molding layer 130 may further extend into a gap between the first package substrate 110 and the first semiconductor chip 120. Differently from that shown, an under-fill pattern may further be provided to a gap between the first package substrate 110 and the first semiconductor chip 120. The under-fill pattern may be formed by performing a thermal compression process using a non-conductive paste or a non-conductive film or under-fill pattern may be formed by performing a capillary under-fill process. The height H1 of the mounted first semiconductor package 100 may be the same as a sum of heights of the first connection terminal 150, the first package substrate 110, and the first molding layer 130.

A first marker 190 may be provided on the first molding layer 130. For example, the first marker 190 may be provided on the top surface of the first molding layer 130. For another example, the first marker 190 may be provided on a side surface of the first molding layer 130. The first marker 190 may be a recess portion of the first molding layer 130. The formation of the first marker 190 may include removing a portion of the first molding layer 130. When the first marker 190 is formed on the first semiconductor chip 120, the first semiconductor chip 120 may be damaged during the formation of the first marker 190. For example, a crack may be formed on or in the first semiconductor chip 120. In certain embodiments, because the first marker 190 is provided on the first molding layer 130, the first semiconductor chip 120 may be limited and/or prevented from being damaged during the formation of the first marker 190. The first marker 190 may express information about the first semiconductor package 100. In figures other than FIGS. 1G and 1H, the first marker 190 is not illustrated for the purpose of convenience, but inventive concepts are not limited thereto.

The first thermal conductive layer 710 may be provided on the top surface 100a of the first semiconductor package 100. The formation of the first thermal conductive layer 710 may include providing a thermal interface material on the first semiconductor package 100 and curing the thermal interface material. The thermal interface material before being cured may have fluidity. When the first thermal conductive layer 710 is formed, although the thermal interface material on an edge region of the top surface 100a of the first semiconductor package 100 flows downwardly along a side surface 100c of the first semiconductor package 100, the thermal interface material on a central region of the top surface 100a of the first semiconductor package 100 may not flow downwardly. The first thermal conductive layer 710 may desirably fill a gap between the heat radiation structure 600 and the central region of the top surface 100a of the first semiconductor package 100. For example, a top surface 710a of the first thermal conductive layer 710 on a central region of the first semiconductor package 100 may physically contact the heat radiation structure 600. Because the first molding layer 130 is provided, the central region of the first semiconductor package 100 may correspond to a zone where the first semiconductor chip 120 is provided. Even though the thermal interface material flows downwardly during the formation of the first thermal conductive layer 710, the first thermal conductive layer 710 may successfully transmit heat generated from the first semiconductor chip 120. When the first marker 190 is provided on the first molding layer 130, the first thermal conductive layer 710 may extend into the first marker 190.

Figure 1I:
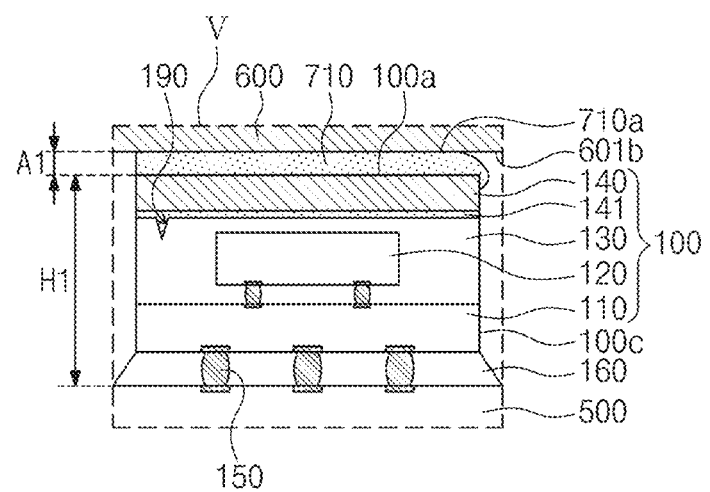
FIGS. 1I and 1J illustrate cross-sectional views showing a first semiconductor package according to some example embodiments, corresponding to a cross-sectional view taken along line I'-II' of FIG. 1G and an enlarged view of section V in FIG. 1C.

FIG. 1I illustrates a first semiconductor package according to some example embodiments, corresponding to an enlarged view of section V in FIG. 1C and to a cross-sectional view taken along line I'-II' of FIG. 1G.

Referring to FIGS. 1C, 1G, and 1I, the first semiconductor package 100 may include the first package substrate 110, the first semiconductor chip 120, the first molding layer 130, first adhesive layer 141, and a first thermal conductive structure 140.

The first thermal conductive structure 140 may include a thermal conductive material discussed in the example of FIGS. 1A to 1C, and may have a relatively high thermal conductivity. The first thermal conductive structure 140 may include a metal layer, a heat sink, or a heat pipe. A first adhesive layer 141 may be provided between the first molding layer 130 and the first thermal conductive structure 140. The first adhesive layer 141 may attach the first thermal conductive structure 140 to the first molding layer 130. The first adhesive layer 141 may include a thermal interface material. When the first semiconductor package 100 is operated, heat generated from the first semiconductor chip 120 may be transmitted to the heat radiation structure 600 through the first adhesive layer 141, the first thermal conductive structure 140, and the first thermal conductive layer 710.

In certain embodiments, the top surface 100a of the first semiconductor package 100 may correspond to a top surface of the first thermal conductive structure 140. The height H1 of the mounted first semiconductor package 100 may be the same as a sum of heights of the first connection terminal 150, the first package substrate 110, the first molding layer 130, the first adhesive layer 141, and the first thermal conductive structure 140. For example, even though the top surface of the first molding layer 130 is located at a lower level than that of the top surface 200a of the second semiconductor package 200 and that of the top surface 300a of the third semiconductor package 300, because the first adhesive layer 141 and the first thermal conductive structure 140 are provided, the height H1 of the mounted first semiconductor package 100 may be greater than the height H2 of the mounted second semiconductor package 200 and the height H3 of the mounted third semiconductor package 300. Therefore, the height A1 of the first thermal conductive layer 710 may be less than the height A2 of the second thermal conductive layer 720 and the height A3 of the third thermal conductive layer 730. The first semiconductor package 100 may improve in thermal characteristics.

Figure 1J:
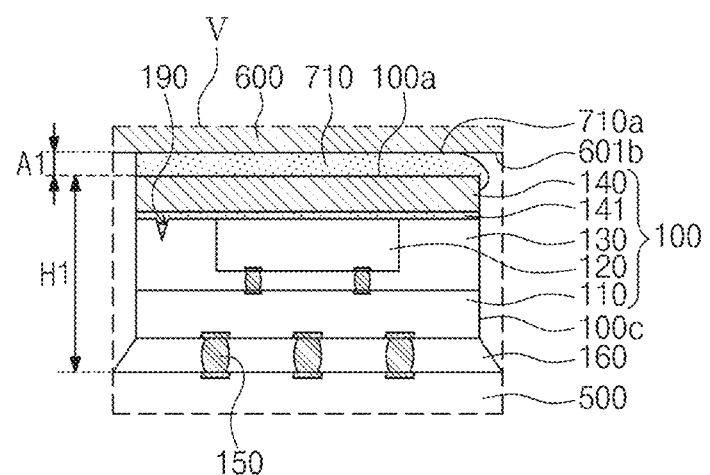

FIG. 1J illustrates a first semiconductor package according to some example embodiments, corresponding to a cross-sectional view taken along line I'-II' of FIG. 1G and to an enlarged view of section V in FIG. 1C.

Referring to FIGS. 1C, 1G, and 1J, the first semiconductor package 100 may include the first semiconductor chip 120, the first molding layer 130, first adhesive layer 141, and the first thermal conductive structure 140. The first molding layer 130 may cover the side surface of the first semiconductor chip 120 and may expose the top surface of the first semiconductor chip 120. In this case, the top surface 100a of the first semiconductor package 100 may correspond to the top surface of the first molding layer 130 and the top surface of the first semiconductor chip 120, which top surface of the first semiconductor chip 120 is exposed by the first molding layer 130. The exposed top surface of the first semiconductor chip 120 may physically and directly contact the first adhesive layer 141. Therefore, the first semiconductor package 100 may improve in heat radiation characteristics.

Figure 1K:
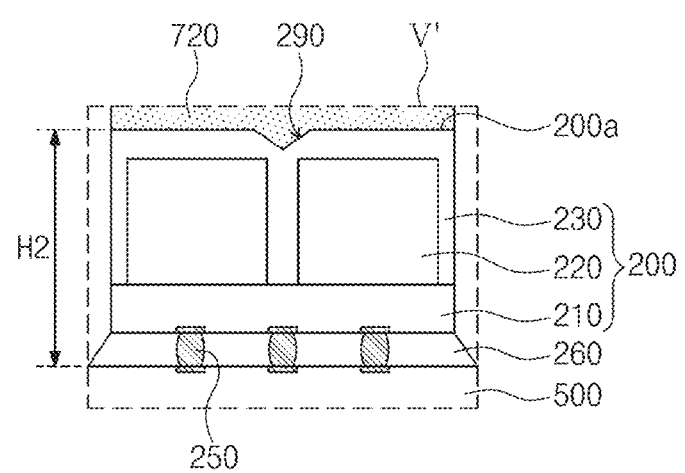
FIGS. 1K and 1L illustrate cross-sectional views showing a second semiconductor package according to some example embodiments, corresponding to an enlarged view of section V' in FIG. 1C.

FIG. 1K illustrates an enlarged view of section V' in FIG. 1C, showing a second semiconductor package according to some example embodiments.

Referring to FIGS. 1C and 1K, the second semiconductor package 200 may include a second package substrate 210, a second semiconductor chip 220, and a second molding layer 230. A printed circuit board (PCB) or a redistribution layer may be used as the second package substrate 210. The second semiconductor chip 220 may be mounted in a flip-chip manner or a wire bonding manner. The second semiconductor chip 220 may be of a different type from the first semiconductor chip 120. For example, the second semiconductor chip 220 may serve as a memory chip. The memory chip may include a DRAM. For another example, the memory chip may include an SRAM, MRAM, or NAND Flash memory. Heat generation from the second semiconductor package 200 during its operation may mean heat generation from the second semiconductor chip 220. The second semiconductor package 200 may include a plurality of the second semiconductor chips 220. For another example, the second semiconductor package 200 may include a single second semiconductor chip 220. For brevity of description, it will be hereinafter explained an example in which a single second semiconductor chip 220 is provided.

The second molding layer 230 may be provided on the second package substrate 210, covering the second semiconductor chip 220. The second molding layer 230 may include a dielectric polymer such as an epoxy polymer. When the second semiconductor chip 220 is mounted in a flip-chip manner, the second molding layer 230 may further extend into a gap between the second semiconductor chip 220 and the second package substrate 210. For another example, an under-fill pattern (not shown) may further be provided to fill a gap between the second package substrate 210 and the second semiconductor chip 220. The second molding layer 230 may cover side and top surfaces of the second semiconductor chip 220. In this case, the top surface 200a of the second semiconductor package 200 may correspond to a top surface of the second molding layer 230. For another example, the second molding layer 230 may cover the side surface of the second semiconductor chip 220 and may expose the top surface of the second semiconductor chip 220. In this case, the top surface 200a of the second semiconductor package 200 may correspond to the top surface of the second molding layer 230 and the top surface of the second semiconductor chip 220, which top surface of the second semiconductor chip 220 is exposed by the second molding layer 230. The height H2 of the mounted second semiconductor package 200 may be defined as a sum of heights of the second connection terminal 250, the second package substrate 210, and the second molding layer 230.

A second marker 290 may further be provided on the second molding layer 230. The second marker 290 may be a recess portion of the second molding layer 230. The second marker 290 may express information about the second semiconductor package 200.

The second thermal conductive layer 720 may be formed on the top surface of the second molding layer 230. The second thermal conductive layer 720 may be formed by the same method as that used for the formation of the first thermal conductive layer 710. Even though a thermal interface material partially flows downwardly when the second thermal conductive layer 720 is formed, the second thermal conductive layer 720 may desirably fill a gap between the heat radiation structure 600 and a central region of the top surface 200a of the second semiconductor package 200. The central region of the top surface 200a of the second semiconductor package 200 may correspond to a zone where the second semiconductor chip 220 is provided. Therefore, the second thermal conductive layer 720 may successfully transmit heat generated from the second semiconductor chip 220. The second thermal conductive layer 720 may further extend into the second marker 290.

Figure 1L:
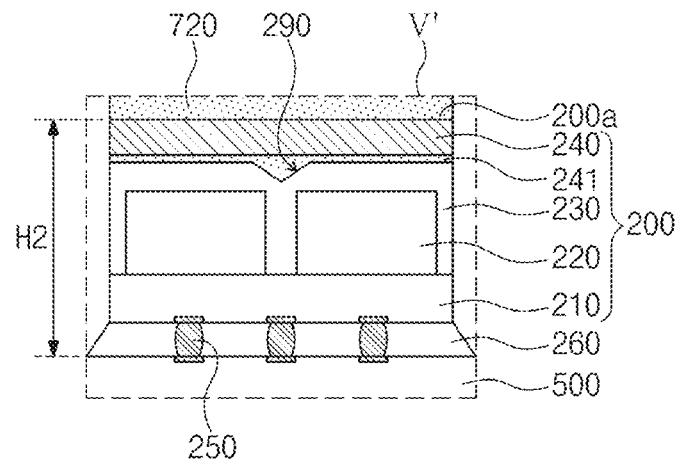

FIG. 1L illustrates an enlarged view of section V' in FIG. 1C, showing a second semiconductor package according to some example embodiments.

Referring to FIGS. 1C and 1L, the second semiconductor package 200 may include the second package substrate 210, the second semiconductor chip 220, the second molding layer 230, a second adhesive layer 241 and a second thermal conductive structure 240. The second thermal conductive structure 240 may include a thermal conductive material and may have a relatively high thermal conductivity. The second thermal conductive structure 240 may include a metal layer, a heat sink, or a heat pipe. The second adhesive layer 241 may be provided between the second molding layer 230 and the second thermal conductive structure 240. The second adhesive layer 241 may include a thermal interface material. When the second semiconductor package 200 is operated, heat generated from the second semiconductor chip 220 may be transmitted to the second thermal conductive layer 720 through the second adhesive layer 241 and the second thermal conductive structure 240.

The top surface 200a of the second semiconductor package 200 may correspond to a top surface of the second thermal conductive structure 240. The height H2 of the mounted second semiconductor package 200 may be the same as a sum of heights of the second connection terminal 250, the second package substrate 210, the second molding layer 230, the second adhesive layer 241, and the second thermal conductive structure 240.

Figure 1M:
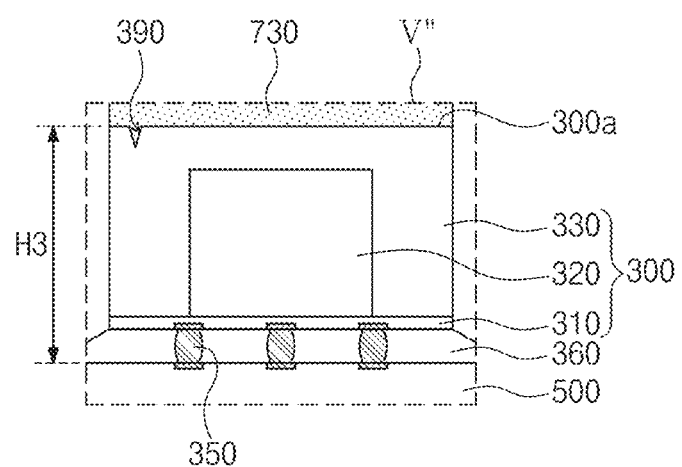
FIGS. 1M and 1N illustrate cross-sectional views showing a third semiconductor package according to some example embodiments, corresponding to an enlarged view of section V'' in FIG. 1C.

FIG. 1M illustrates an enlarged view of section V" in FIG. 1C, showing a third semiconductor package according to some example embodiments.

Referring to FIGS. 1C and 1M, the third semiconductor package 300 may include a third package substrate 310, a third semiconductor chip 320, and a third molding layer 330. A redistribution layer or a printed circuit board may be used as the third package substrate 310. The third semiconductor chip 320 may be of a different type from the first and second semiconductor chips 120 and 220. For example, the third semiconductor chip 320 may include a power management integrated circuit (PMIC) and may serve as a power management chip. Heat generation from the third semiconductor package 300 during its operation may mean heat generation from the third semiconductor chip 320. The third molding layer 330 may be provided on the third package substrate 310, covering the third semiconductor chip 320. The third molding layer 330 may cover top and side surfaces of the third semiconductor chip 320. In this case, the top surface 300a of the third semiconductor package 300 may correspond to a top surface of the third molding layer 330. For another example, the third molding layer 330 may cover the side surface of the third semiconductor chip 320 and may expose the top surface of the third semiconductor chip 320. In this case, the top surface 300a of the third semiconductor package 300 may correspond to the top surface of the third molding layer 330 and the top surface of the third semiconductor chip 320, which top surface of the third semiconductor chip 320 is exposed by the third molding layer 330. The third molding layer 330 may include a dielectric polymer such as an epoxy polymer. The height H3 of the mounted third semiconductor package 300 may be defined as a sum of heights of the third connection terminal 350, the third package substrate 310, and the third molding layer 330.

The third semiconductor package 300 may be formed into a fan-out panel level package or a fan-out wafer level package. The formation of the third semiconductor package 300 may include providing the third semiconductor chip 320 on a carrier substrate (not shown), forming the third molding layer 330 to cover the third semiconductor chip 320, removing the carrier substrate to expose a bottom surface of the third semiconductor chip 320, and a forming a redistribution layer on the exposed bottom surface of the third semiconductor chip 320 and a bottom surface of the third molding layer 330. The redistribution layer may be used as the third package substrate 310.

Figure 1N:
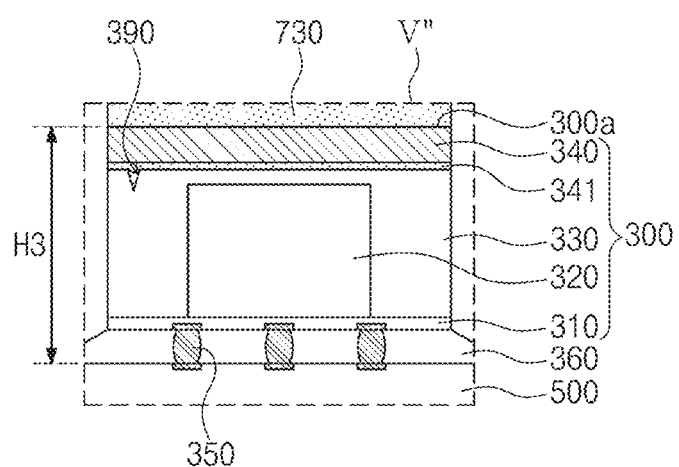

FIG. 1N illustrates an enlarged view of section V" in FIG. 1C, showing a third semiconductor package according to some example embodiments.

Referring to FIGS. 1C and 1N, the third semiconductor package 300 may include the third package substrate 310, the third semiconductor chip 320, the third molding layer 330, and a third thermal conductive structure 340. The third thermal conductive structure 340 may include a thermal conductive material and may have a relatively high thermal conductivity. The third thermal conductive structure 340 may include a metal layer, a heat sink, or a heat pipe. A third adhesive layer 341 may be provided between the third molding layer 330 and the third thermal conductive structure 340. The third adhesive layer 341 may include a thermal interface material. When the third semiconductor package 300 is operated, heat generated from the third semiconductor chip 320 may be transmitted to the third thermal conductive layer 730 through the third adhesive layer 341 and the third thermal conductive structure 340.

The top surface 300a of the third semiconductor package 300 may correspond to a top surface of the third thermal conductive structure 340. The height H3 of the mounted third semiconductor package 300 may be the same as a sum of heights of the third connection terminal 350, the third package substrate 310, the third molding layer 330, the third adhesive layer 341, and the third thermal conductive structure 340.

A third marker 390 may further be provided on the third molding layer 330. The third marker 390 may be a recess portion of the third molding layer 330.

Referring to FIGS. 1C, 1M and 1N, the third thermal conductive layer 730 may be formed on the top surface 300a of the third semiconductor package 300. The third thermal conductive layer 730 may be formed by the same method as that used for the formation of the first thermal conductive layer 710. Even though a thermal interface material on an edge region of the top surface 300a of the third semiconductor package 300 partially flows downwardly, the third thermal conductive layer 730 may desirably fill a gap between the heat radiation structure 600 and a central region of the top surface 300a of the third semiconductor package 300. The central region of the top surface 300a of the third semiconductor package 300 may correspond to a zone where the third semiconductor chip 320 is provided. Therefore, the third thermal conductive layer 730 may successfully transmit heat generated from the third semiconductor package 300.

Figure 2A:
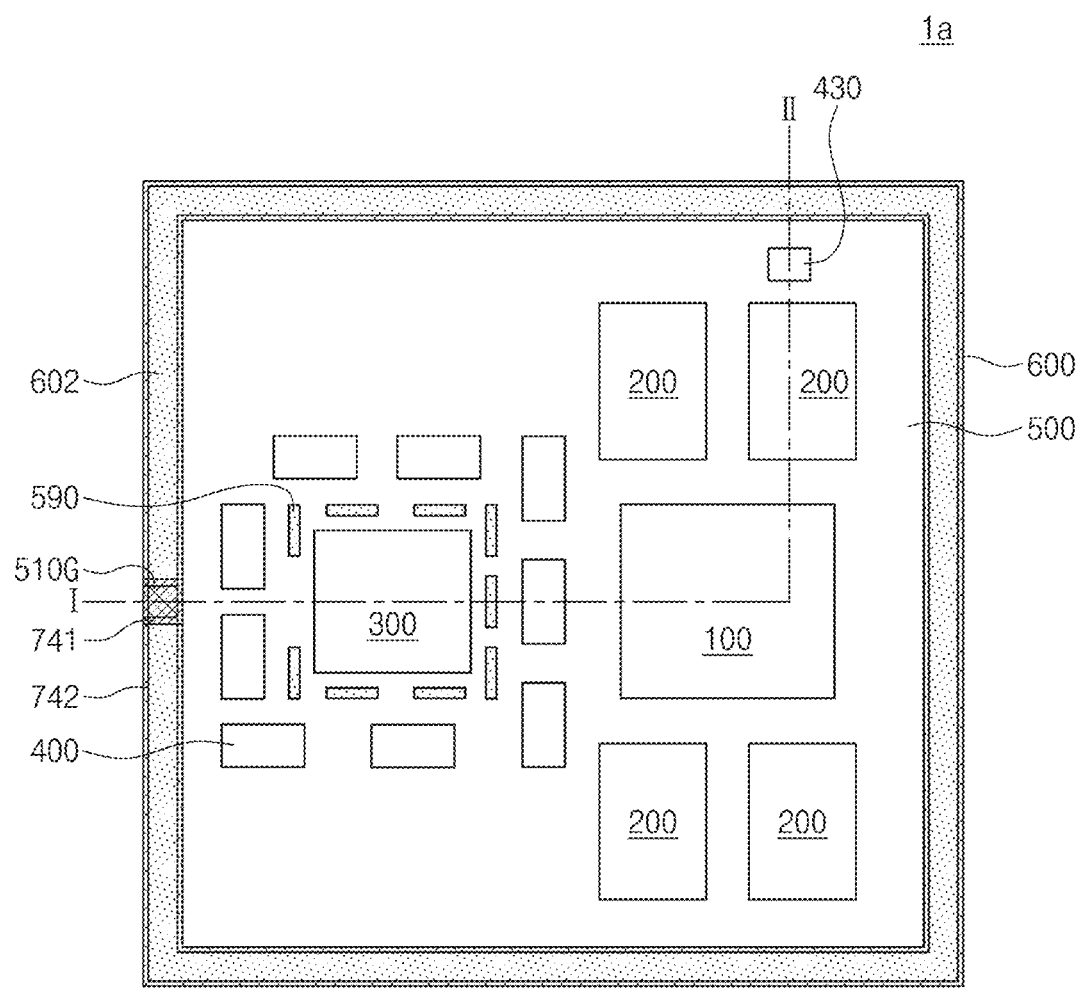
FIG. 2A illustrates a plan view showing a package system according to some example embodiments.
Figure 2B:
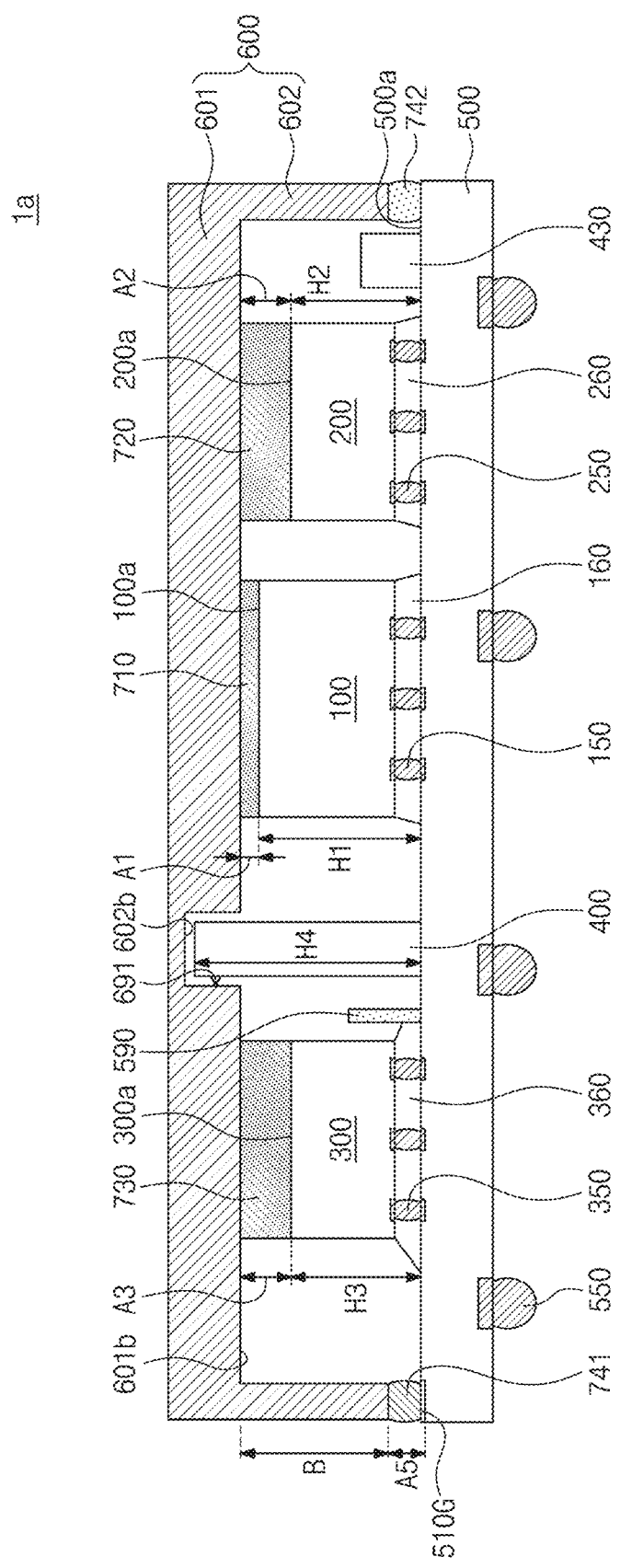
FIG. 2B illustrates a cross-sectional view taken along line I-II of FIG. 2A.

FIG. 2A illustrates a plan view showing a package system according to some example embodiments. FIG. 2B illustrates a cross-sectional view taken along line I-II of FIG. 2A.

Referring to FIGS. 2A and 2B, a package system 1a may include the substrate 500, the first, second, and third semiconductor packages 100, 200, and 300, the first passive device 400, the first, second, and third thermal conductive layers 710, 720, and 730, and the heat radiation structure 600. The description of the substrate 500, the first, second, and third semiconductor packages 100, 200, and 300, the first passive device 400, the first, second, and third thermal conductive layers 710, 720, and 730, and the heat radiation structure 600 may be identical to that discussed above with reference to FIGS. 1A to 1N.

A ground pad 510G may be provided on the top surface 500a of the substrate 500. One or more of the conductive terminals 550 may serve as ground terminals. A ground voltage may be applied to the ground pad 510G through the ground terminal and the substrate 500.

The heat radiation structure 600 may include a body portion 601 and a leg portion 602. The body portion 601 of the heat radiation structure 600 may be similar to the heat radiation structure 600 discussed above with reference to FIGS. 1A to 1C. For example, the body portion 601 may be provided on the first, second, and third semiconductor packages 100, 200, and 300 and on the first passive device 400. A trench may be formed on the first bottom surface 601b of the body portion 601. The trench may be the first trench 691 discussed with reference to FIGS. 1A to 1C. The first bottom surface 601b and the second bottom surface 602b of the heat radiation structure 600 may be provided on the body portion 601. The first thermal conductive layer 710 may physically contact the first bottom surface 601b of the heat radiation structure 600.

The leg portion 602 of the heat radiation structure 600 may be provided between the substrate 500 and an edge region of the body portion 601. The leg portion 602 of the heat radiation structure 600 may be connected to the body portion 601 of the heat radiation structure 600. As shown in FIG. 2A, the first, second, and third semiconductor packages 100, 200, 300 and the first passive device 400 may be spaced apart from the leg portion 602 of the heat radiation structure 600. When viewed in plan, the leg portion 602 may be provided on an edge region of the substrate 500.

Adhesive patterns 741 and 742 may be provided between the substrate 500 and the leg portion 602 of the heat radiation structure 600, fixing the heat radiation structure 600 to the substrate 500. The adhesive patterns 741 and 742 may include a conductive adhesive pattern 741 and a dielectric adhesive pattern 742. The conductive adhesive pattern 741 may be provided between the ground pad 510G and a bottom surface of the leg portion 602 of the heat radiation structure 600. The heat radiation structure 600 may be coupled through the conductive adhesive pattern 741 to the ground pad 510G.

When a certain amount of charges are accumulated on the heat radiation structure 600, the charges may flow from the heat radiation structure 600 into other electrical conductive components, which may result in damage to the electrical conductive components. The electrical conductive components may include one or more of integrated circuits and wiring lines in the first, second, and third semiconductor chips 120, 220, and 320, wiring lines in the first, second, and third package substrates 110, 210, and 310, the first, second, and third connection terminals 150, 250, and 350, and wiring lines in the substrate 500. In certain embodiments, a ground voltage may be applied through the conductive adhesive pattern 741 to the heat radiation structure 600. The heat radiation structure 600 may then limit and/or prevent the package system 1a from electrical damage due to electrostatic discharge (ESD).

The heat radiation structure 600 may have an electrical conductivity, and thus may shield electromagnetic interference (EMI) of the first, second, and third semiconductor packages 100, 200, and 300. The electromagnetic interference may mean that communication operations of electrical components suffer from disturbance caused by electromagnetic waves emitted or transmitted from other electrical components. The heat radiation structure 600 may limit and/or prevent operations of the first passive device 400 and the first, second, and third semiconductor packages 100, 200, and 300 from interrupting or being interrupted by operations of other packages.

The dielectric adhesive pattern 742 may be provided between the substrate 500 and the heat radiation structure 600. The heat radiation structure 600 may thus be insulated from the substrate 500, which may result in the suppression of electrical short. The dielectric adhesive pattern 742 may have the same height as a height A5 of the conductive adhesive pattern 741.

Referring to FIG. 2B, the leg portion 602 of the heat radiation structure 600 may have a height B the same as a maximum vertical length of an inner side surface of the heat radiation structure 600. The height B of the leg portion 602 of the heat radiation structure 600 may be less than the height H1 of the mounted first semiconductor package 100. Therefore, the height A1 of the first thermal conductive layer 710 may be less than the height A5 of the conductive adhesive pattern 741. Because the height A1 of the first thermal conductive layer 710 is relatively small, heat generated from the first semiconductor package 100 may be promptly transmitted through the first thermal conductive layer 710 to the heat radiation structure 600.

Figure 2C:
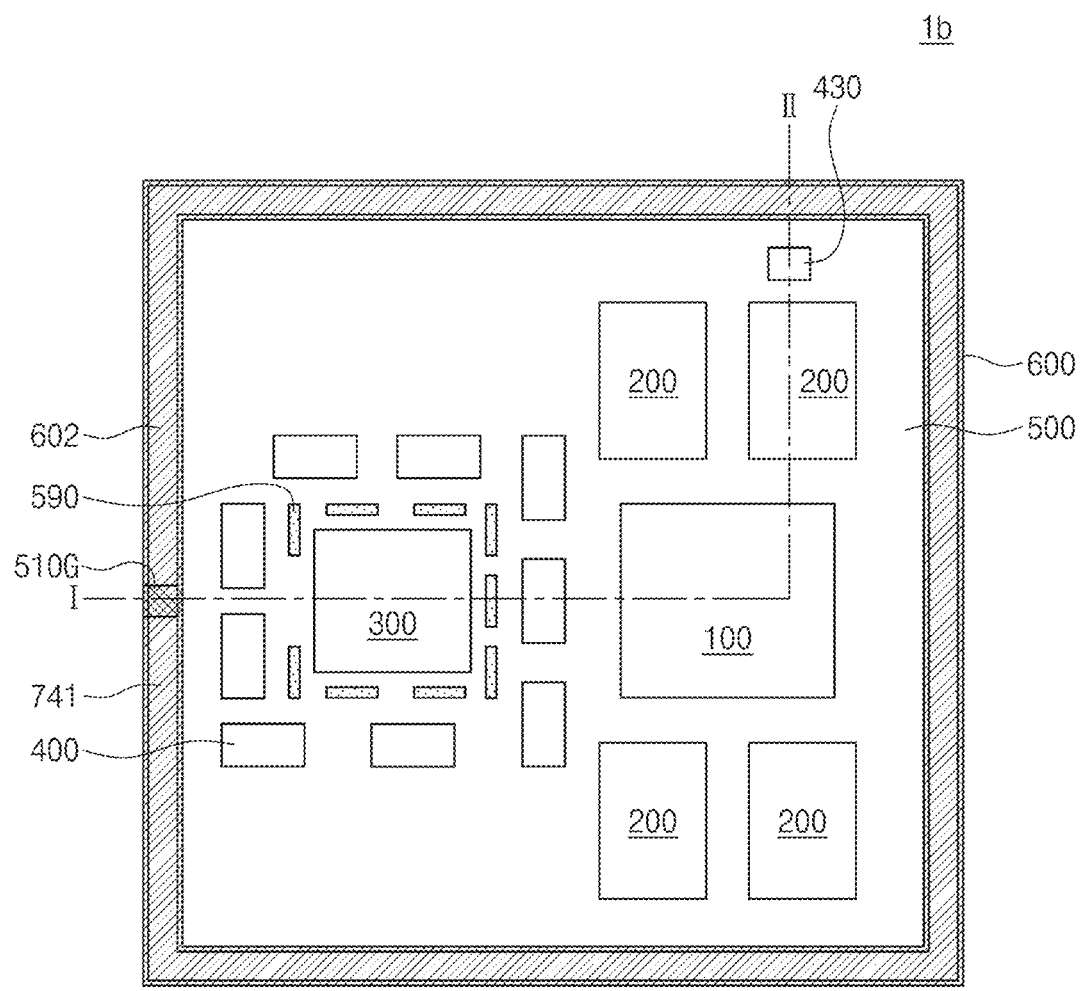
FIG. 2C illustrates a plan view showing a package system according to some example embodiments.
Figure 2D:
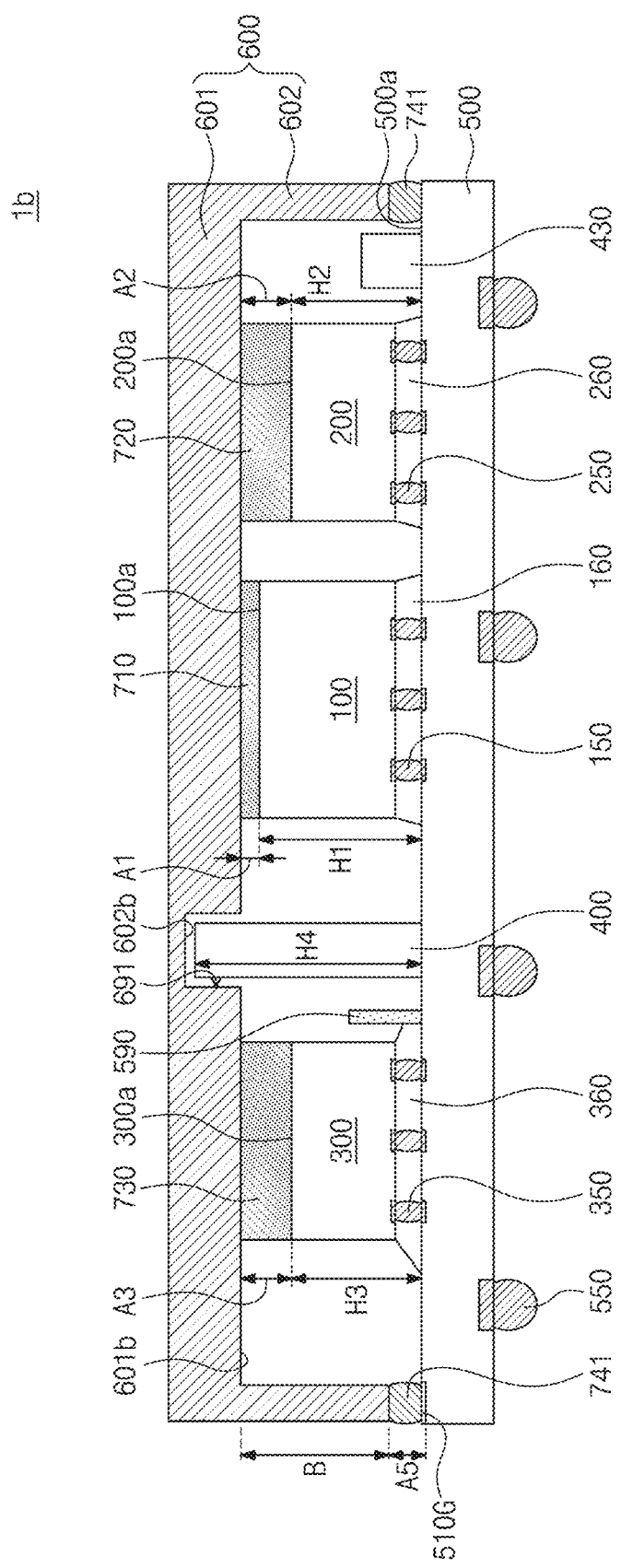
FIG. 2D illustrates a cross-sectional view taken along line I-II of FIG. 2C.

FIG. 2C illustrates a plan view showing a package system according to some example embodiments. FIG. 2D illustrates a cross-sectional view taken along line I-II of FIG. 2C.

Referring to FIGS. 2C and 2D, a package system 1b may include the substrate 500, the first, second, and third semiconductor packages 100, 200, and 300, the first passive device 400, the first, second, and third thermal conductive layers 710, 720, and 730, and the heat radiation structure 600. The description of the heat radiation structure 600 may be identical to that discussed in FIGS. 2A and 2B. For example, the heat radiation structure 600 may include the body portion 601 and the leg portion 602.

The conductive adhesive pattern 741 may be provided between the ground pad 510G and the leg portion 602 of the heat radiation structure 600, electrically connecting the heat radiation structure 600 and the ground pad 510G to each other. The height A1 of the first thermal conductive layer 710 may be less than the height A5 of the conductive adhesive pattern 741. Differently from the example of FIGS. 2A and 2B, the dielectric adhesive pattern 742 may not be provided.

Figure 2E:
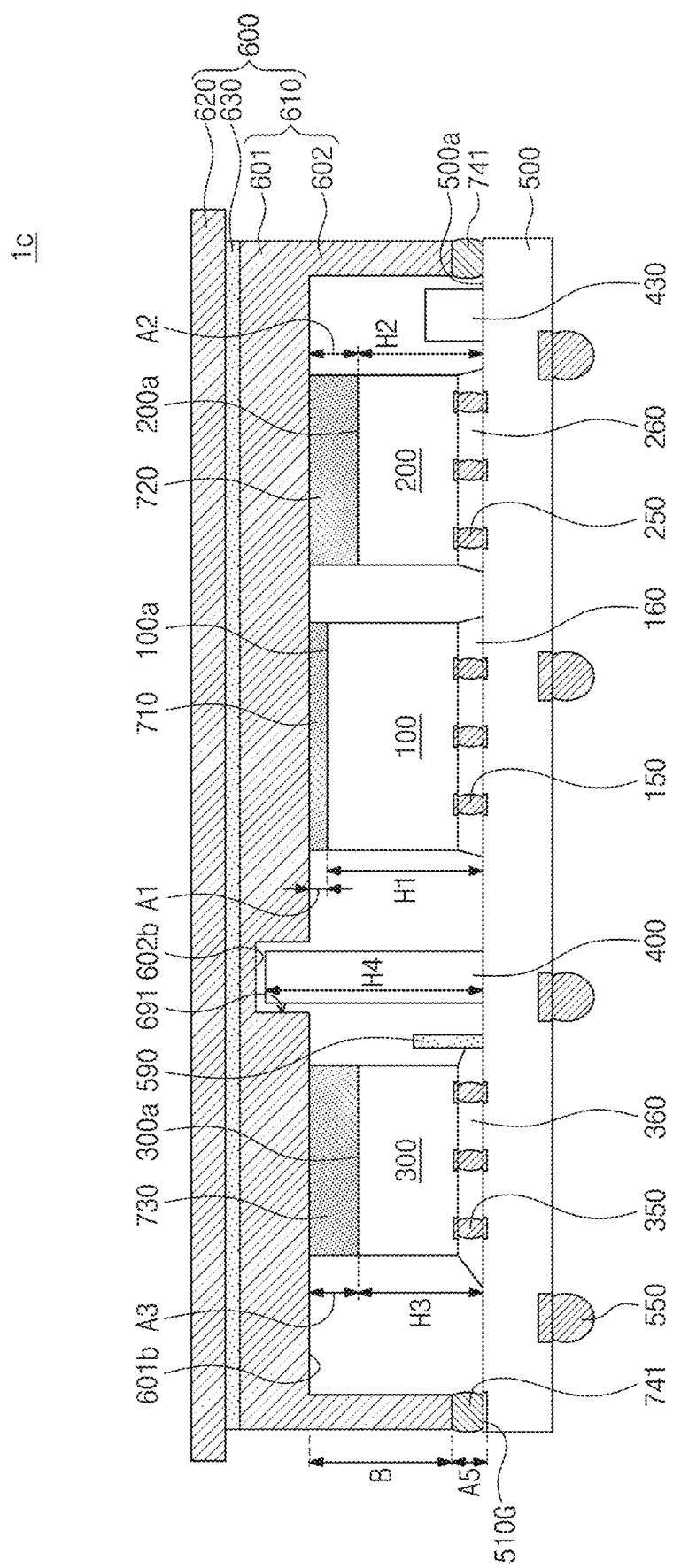
FIG. 2E illustrates a cross-sectional view showing a package system, taken along line I-II of FIG. 2C, according to some example embodiments.

FIG. 2E illustrates a cross-sectional view taken along line I-II of FIG. 2C, showing a package system according to some example embodiments.

Referring to FIGS. 2C and 2E, a package system 1c may include the substrate 500, the first, second, and third semiconductor packages 100, 200, and 300, the first passive device 400, the first, second, and third thermal conductive layers 710, 720, and 730, and the heat radiation structure 600.

The heat radiation structure 600 may include a first heat radiation structure 610, a second heat radiation structure 620, and a heat radiation adhesive layer 630. The first heat radiation structure 610 may be the same as the example discussed above with reference to FIGS. 2A and 2B or the example discussed above with reference to FIGS. 2C and 2D. For example, the first heat radiation structure 610 may include the body portion 601 and the leg portion 602. The first trench 691 may be provided on the first bottom surface 601b of the first heat radiation structure 610. The conductive adhesive pattern 741 may be provided between the ground pad 510G and the first heat radiation structure 610. For another example, the dielectric adhesive pattern 742 may further be provided as discussed above with reference to FIGS. 2A and 2B.

The second heat radiation structure 620 may be provided on the first heat radiation structure 610. The second heat radiation structure 620 may be the same as the heat radiation structure 600 discussed above with reference to FIGS. 1A to 1C. In contrast, the second heat radiation structure 620 may have no trench. The second heat radiation structure 620 may have a flat bottom surface.

The heat radiation adhesive layer 630 may be interposed between the first and second heat radiation structures 610 and 620. The second heat radiation structure 620 may be attached through the heat radiation adhesive layer 630 to the first heat radiation structure 610. The heat radiation adhesive layer 630 may include, for example, a thermal interface material.

Figure 3A:
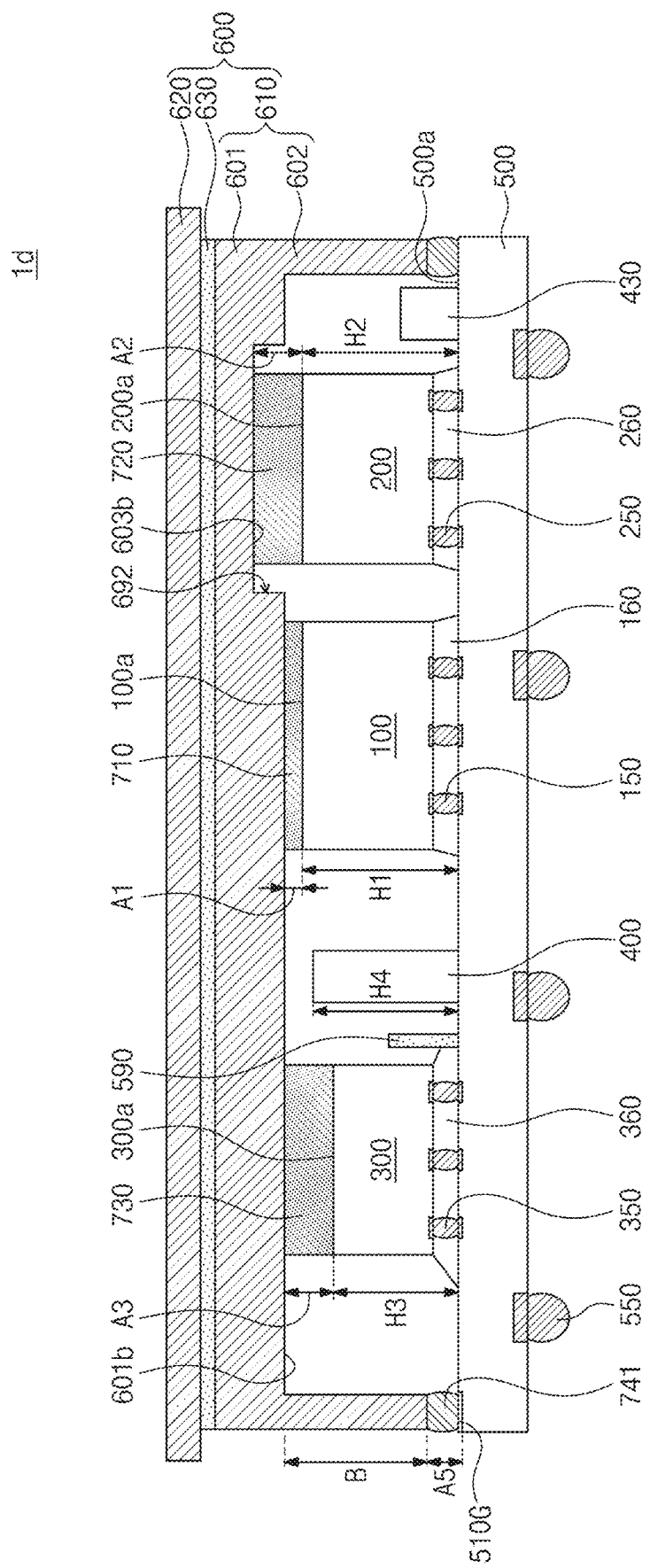
FIGS. 3A to 3D illustrate cross-sectional views showing a package system, taken along line I-II of FIG. 2C, according to some example embodiments.

FIG. 3A illustrates a cross-sectional view taken along line I-II of FIG. 2C, showing a package system according to some example embodiments.

Referring to FIGS. 2C and 3A, a package system 1d may include the substrate 500, the first, second, and third semiconductor packages 100, 200, and 300, the first passive device 400, the first, second, and third thermal conductive layers 710, 720, and 730, and the heat radiation structure 600. The first heat radiation structure 610 may have a width the same as or greater than that of the second heat radiation structure 620.

The height H2 of the mounted second semiconductor package 200 may be the same as or greater than the height H1 of the mounted first semiconductor package 100. For example, the top surface 200a of the second semiconductor package 200 may be located at a level the same as or higher than that of the top surface 100a of the first semiconductor package 100.

A second trench 692 may be provided on the first bottom surface 601b of the heat radiation structure 600. The heat radiation structure 600 may have a third bottom surface 603b at a higher level than that of the first bottom surface 601b. The third bottom surface 603b may correspond to a bottom surface of the second trench 692. The third bottom surface 603b of the heat radiation structure 600 may be provided on the second semiconductor package 200. When viewed in plan, the second trench 692 may overlap the second semiconductor package 200. The second thermal conductive layer 720 may be provided on the top surface 200a of the second semiconductor package 200 and may physically contact the bottom surface of the second trench 692 (i.e., the third bottom surface 603b). At least a portion of a side surface of the second thermal conductive layer 720 may face a sidewall of the second trench 692. In certain embodiments, even though the height H2 of the second semiconductor package 200 is great, because the second trench 692 is provided, the height A1 of the first thermal conductive layer 710 may be less than the height A2 of the second thermal conductive layer 720. Therefore, the package system 1d may improve in thermal characteristics.

When the second semiconductor package 200 is provided in plural, the second trench 692 may be provided in plural. The second trenches 692 may overlap corresponding second semiconductor packages 200. For another example, each of the second trenches 692 may overlap at least two second semiconductor packages 200.

The sum of the height H1 of the mounted first semiconductor package 100 and the height A1 of the first thermal conductive layer 710 may be greater than the height H4 of the first passive device 400. For example, the top surface of the first thermal conductive layer 710 may be located at a higher level than that of the top surface of the first passive device 400. The first trench 691 may not be provided. The top surface of the first passive device 400 may face the first bottom surface 601b of the heat radiation structure 600.

Figure 3B:
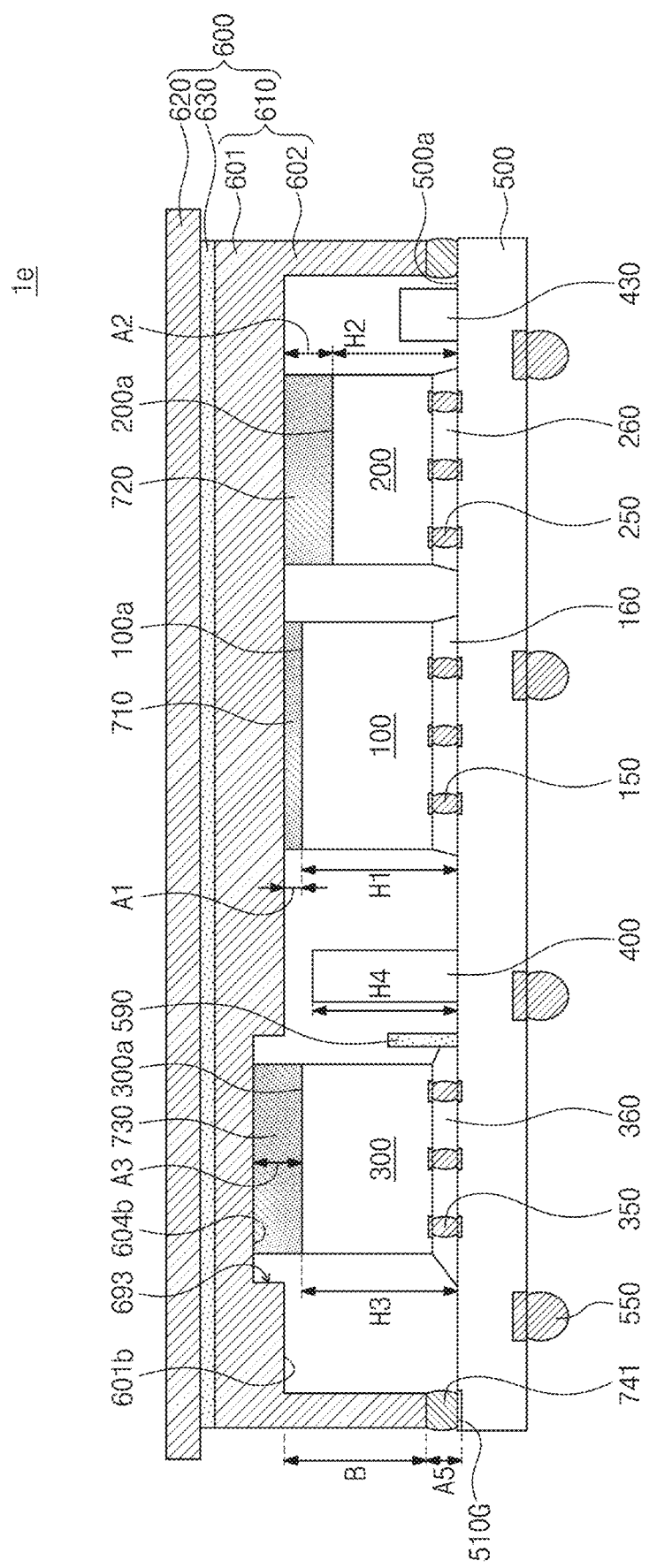

FIG. 3B illustrates a cross-sectional view taken along line I-II of FIG. 2C, showing a package system according to some example embodiments.

Referring to FIGS. 2C and 3B, a package system 1e may include the substrate 500, the first, second, and third semiconductor packages 100, 200, and 300, the first passive device 400, the first, second, and third thermal conductive layers 710, 720, and 730, and the heat radiation structure 600.

The height H3 of the mounted third semiconductor package 300 may be the same as or greater than the height H1 of the mounted first semiconductor package 100. For example, the top surface 300a of the third semiconductor package 300 may be located at a level the same as or higher than that of the top surface 100a of the first semiconductor package 100.

A third trench 693 may be provided on the first bottom surface 601b of the heat radiation structure 600. The heat radiation structure 600 may have a fourth bottom surface 604b at a higher level than that of the first bottom surface 601b. The fourth bottom surface 604b may correspond to a bottom surface of the third trench 693. The fourth bottom surface 604b of the heat radiation structure 600 may be provided on the third semiconductor package 300. When viewed in plan, the third trench 693 may overlap the third semiconductor package 300. The third thermal conductive layer 730 may be provided on the top surface 300a of the third semiconductor package 300 and may physically contact the bottom surface of the third trench 693 (i.e., the fourth bottom surface 604b). At least a portion of a side surface of the third thermal conductive layer 730 may face a sidewall of the third trench 693. In certain embodiments, even though the height H3 of the third semiconductor package 300 is great, because the third trench 693 is provided, the height A1 of the first thermal conductive layer 710 may be less than the height A3 of the third thermal conductive layer 730. Therefore, the package system 1e may improve in thermal characteristics.

The height H1 of the first semiconductor package 100 may be greater than the height H2 of the second semiconductor package 200. The height A1 of the first thermal conductive layer 710 may be less than the height A2 of the second thermal conductive layer 720.

The sum of the height H1 of the mounted first semiconductor package 100 and the height A1 of the first thermal conductive layer 710 may be greater than the height H4 of the first passive device 400. The first trench 691 may not be provided, and the top surface of the first passive device 400 may face the first bottom surface 601b of the heat radiation structure 600.

Figure 3C:
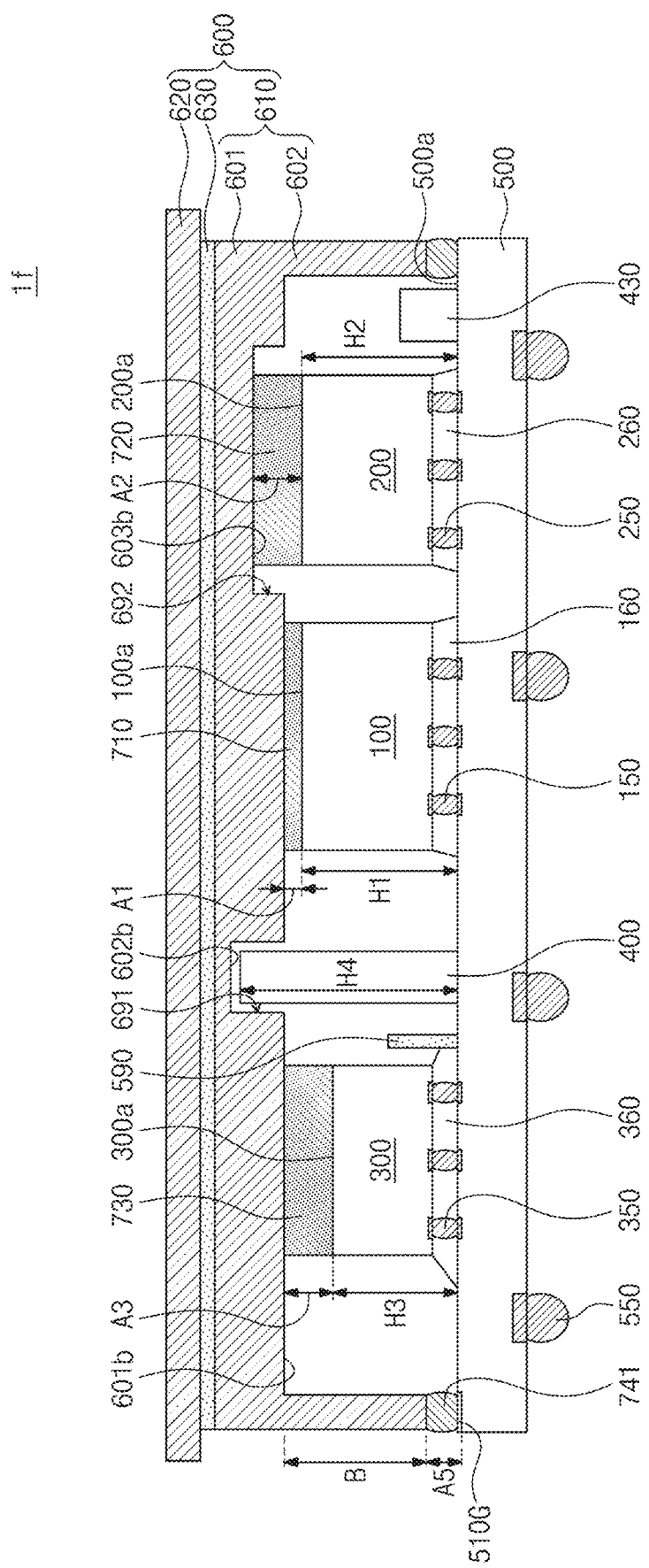
Figure 3D:
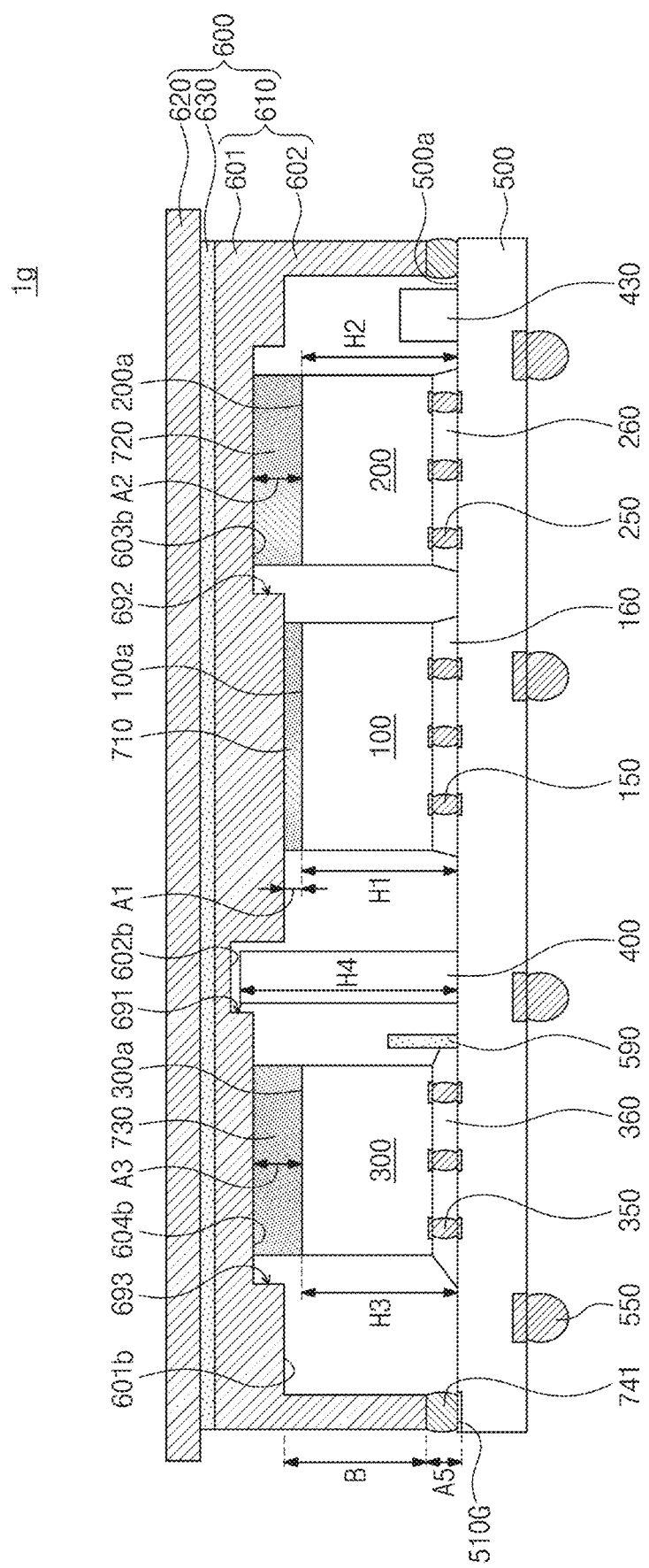

FIG. 3C illustrates a cross-sectional view taken along line I-II of FIG. 2C, showing a package system according to some example embodiments. FIG. 3D illustrates a cross-sectional view taken along line I-II of FIG. 2C, showing a package system according to some example embodiments.

Referring to FIGS. 2C, 3C, and 3D, any of package systems 1f and 1g may include the substrate 500, the first, second, and third semiconductor packages 100, 200, and 300, the first passive device 400, the first, second, and third thermal conductive layers 710, 720, and 730, and the heat radiation structure 600.

The heat radiation structure 600 may include the first trench 691 and the second trench 692. The first and second trenches 691 and 692 may be provided on the first bottom surface 601b of the heat radiation structure 600. The heat radiation structure 600 may therefore have the first bottom surface 601b, the second bottom surface 602b, and the third bottom surface 603b.

The height H4 of the mounted first passive device 400 may be the same as or greater than the sum of the height H1 of the mounted first semiconductor package 100 and the height A1 of the first thermal conductive layer 710. Because the first trench 691 is provided, even though the first passive device 400 is provided on the top surface 500a of the substrate 500, the height A1 of the first thermal conductive layer 710 may be small.

The height H2 of the mounted second semiconductor package 200 may be the same as or greater than the height H1 of the mounted first semiconductor package 100. When viewed in plan, the second trench 692 may overlap the second semiconductor package 200. The second thermal conductive layer 720 may physically contact the third bottom surface 603b of the heat radiation structure 600. The height A1 of the first thermal conductive layer 710 may be less than the height A2 of the second thermal conductive layer 720. The third bottom surface 603b of the heat radiation structure 600 may be provided at a level the same as or different from that of the second bottom surface 602b.

The height H1 of the mounted first semiconductor package 100 may be greater than the height H3 of the mounted third semiconductor package 300, and the third trench 693 may not be provided.

Referring to FIG. 3D, the heat radiation structure 600 may include the third trench 693 in addition to the first trench 691 and the second trench 692, The first, second, and third trenches 691, 692, and 693 may be provided on the first bottom surface 601b of the heat radiation structure 600. The heat radiation structure 600 may therefore have the first bottom surface 601b, the second bottom surface 602b, the third bottom surface 603b, and the fourth bottom surface 604b.

The height H3 of the mounted third semiconductor package 300 may be the same as or greater than the height H1 of the mounted first semiconductor package 100. The third thermal conductive layer 730 may physically contact the fourth bottom surface 604b of the heat radiation structure 600. The level of the fourth bottom surface 604b of the heat radiation structure 600 may depend on the height H1 of the mounted first semiconductor package 100, the height H3 of the mounted third semiconductor package 300, and the height A1 of the first thermal conductive layer 710. Though FIG. 3D shows that the fourth bottom surface 604b of the heat radiation structure 600 is located at a different level from that of the second bottom surface 602b, the fourth bottom surface 604b may be located at the same level as that of the second bottom surface 602b. When the fourth and second bottom surfaces 604b and 602b are located at the same level, the first and third trenches 691 and 693 may be integrally formed into one trench.

In certain embodiments, whether or not the first, second, and third trenches 691, 692, and 693 are provided may depend on the height H4 of the mounted first passive device 400, the height H2 of the mounted second semiconductor package 200, and the height H3 of the mounted third semiconductor package 300. For example, when the height H4 of the mounted first passive device 400 is less than the sum of the height H1 of the mounted first semiconductor package 100 and the height A1 of the first thermal conductive layer 710, the first trench 691 may not be provided. When the height H1 of the mounted first semiconductor package 100 is greater than the height H2 of the mounted second semiconductor package 200, the second trench 692 may not be provided. When the height H1 of the mounted first semiconductor package 100 is greater than the height H3 of the mounted third semiconductor package 300, the third trench 693 may not be provided.

Figure 4:
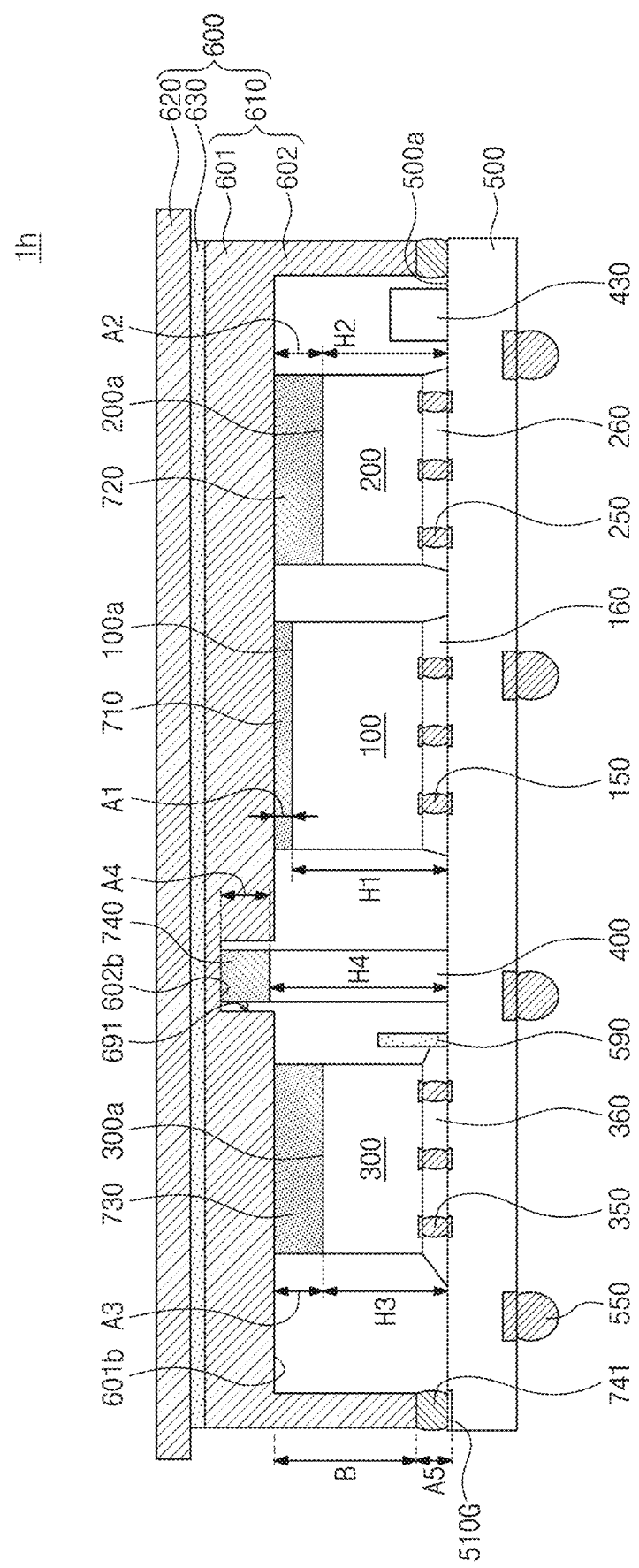
FIG. 4 illustrates a cross-sectional view taken along line I-II of FIG. 2C, showing a package system according to some example embodiments.

FIG. 4 illustrates a cross-sectional view taken along line I-II of FIG. 2C, showing a package system according to some example embodiments.

Referring to FIGS. 2C and 4, a package system 1h may include the substrate 500, the first, second, and third semiconductor packages 100, 200, and 300, the first passive device 400, the first, second, and third thermal conductive layers 710, 720, and 730, the heat radiation structure 600, and a fourth thermal conductive layer 740. The height H4 of the mounted first passive device 400 may be the same as or greater than the height H1 of the mounted first semiconductor package 100. The first trench 691 may be provided on the first bottom surface 601b of the heat radiation structure 600.

The fourth thermal conductive layer 740 may be provided between the first passive device 400 and the heat radiation structure 600. The fourth thermal conductive layer 740 may include a thermal interface material. The fourth thermal conductive layer 740 may contact the second bottom surface 602b of the heat radiation structure 600. Heat generated from the first passive device 400 may be transmitted through the fourth thermal conductive layer 740 to the heat radiation structure 600. When the package system 1h is operated, the first semiconductor package 100 may generate heat whose amount is greater than that of heat generated from the first passive device 400. Because the first trench 691 is provided, the height A1 of the first thermal conductive layer 710 may be less than a height A4 of the fourth thermal conductive layer 740.

Differently from that shown, when the height H4 of the mounted first passive device 400 is less than the height H1 of the mounted first semiconductor package 100, the first trench 691 may not be provided. In this case, the fourth thermal conductive layer 740 may physically contact the first bottom surface 601b of the heat radiation structure 600. For another example, one of the second and third trenches 692 and 693 may further be provided on the first bottom surface 601b of the heat radiation structure 600.

Neither the second heat radiation structure 620 nor the heat radiation adhesive layer 630 may be provided in the examples of FIGS. 3A to 3D and 4. For another example, the first heat radiation structure 610 may have no leg portion 602, and may be spaced apart from the substrate 500. In this case, the conductive adhesive pattern 741 may not be provided. For another example, none of the second heat radiation structure 620, the heat radiation adhesive layer 630, and the leg portion 602 of the heat radiation structure 600 may be provided.

Figure 5A:
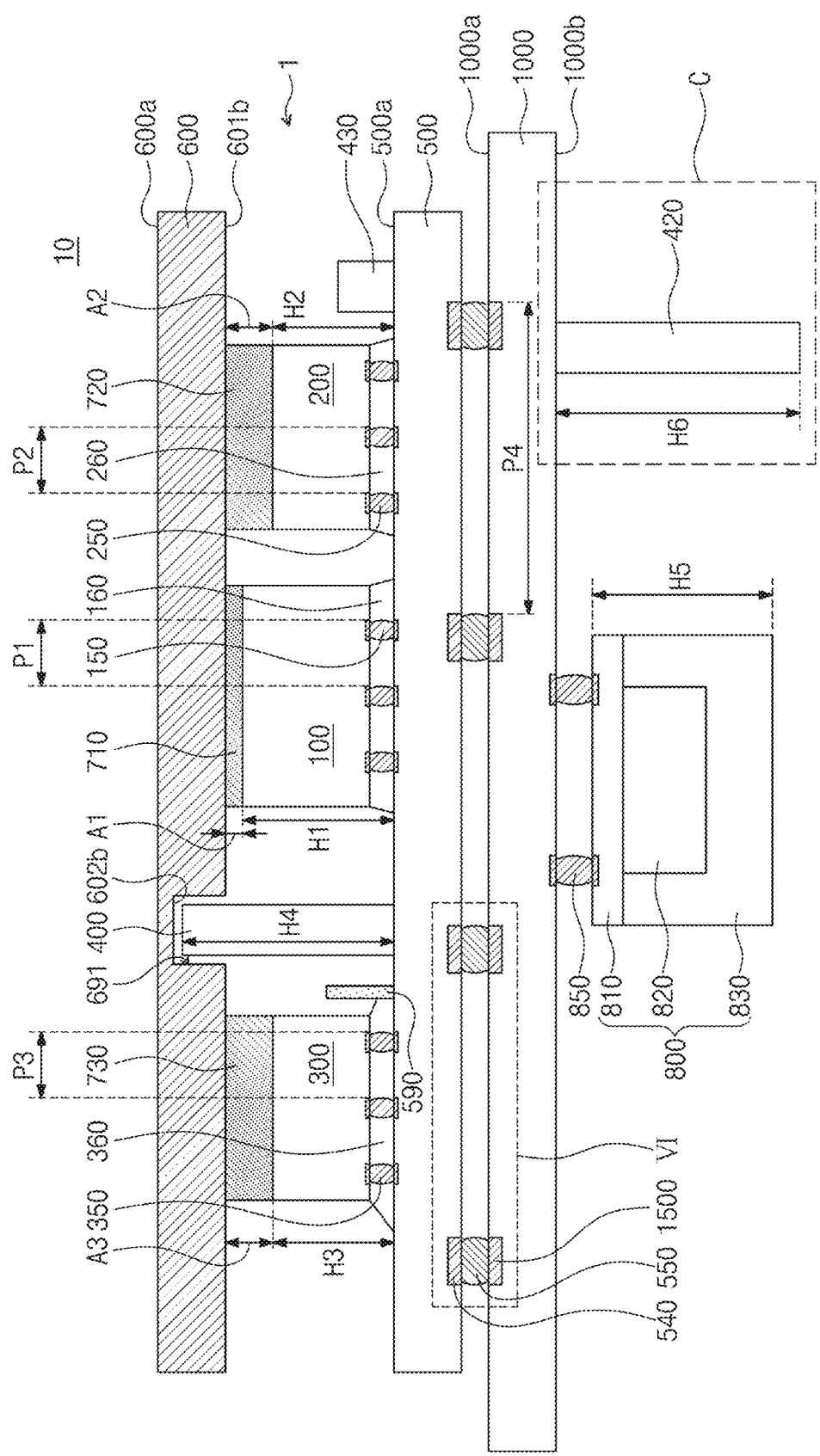
FIG. 5A illustrates a cross-sectional view showing a semiconductor module according to some example embodiments.
Figure 5B:
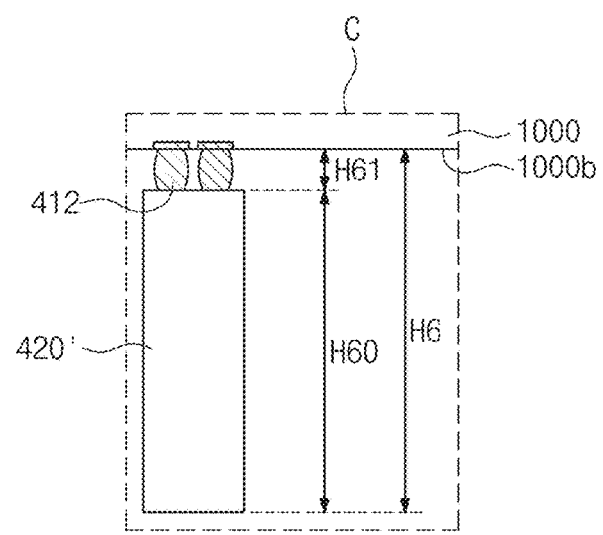
FIG. 5B illustrates an enlarged view of section C in FIG. 5A, showing a second passive device according to some example embodiments.
Figure 5C:
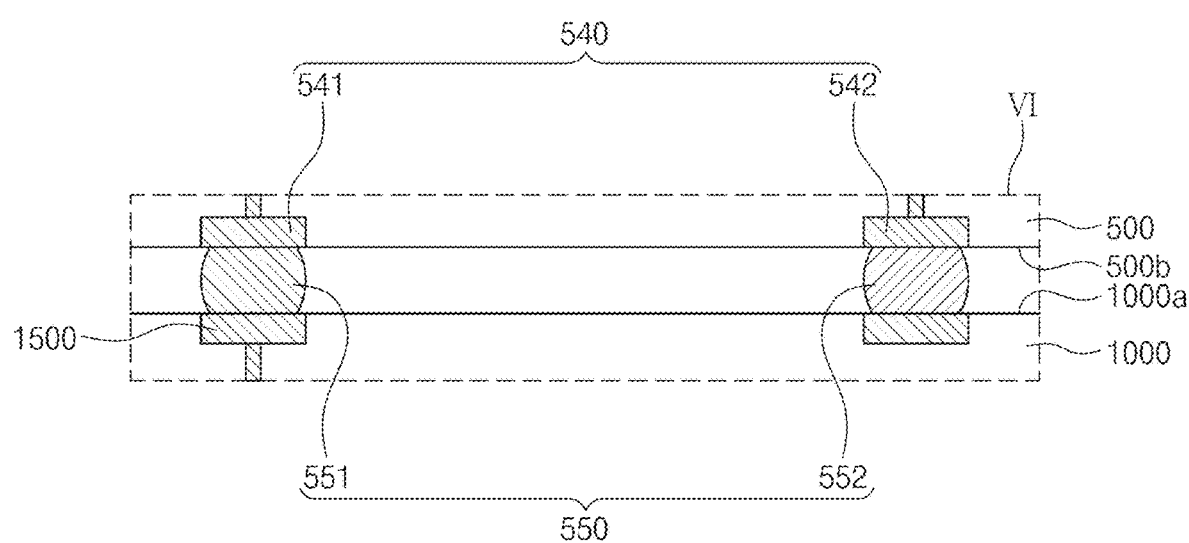
FIG. 5C illustrates a cross-sectional view showing lower pads and conductive terminals according to some example embodiments.
Figure 5D:
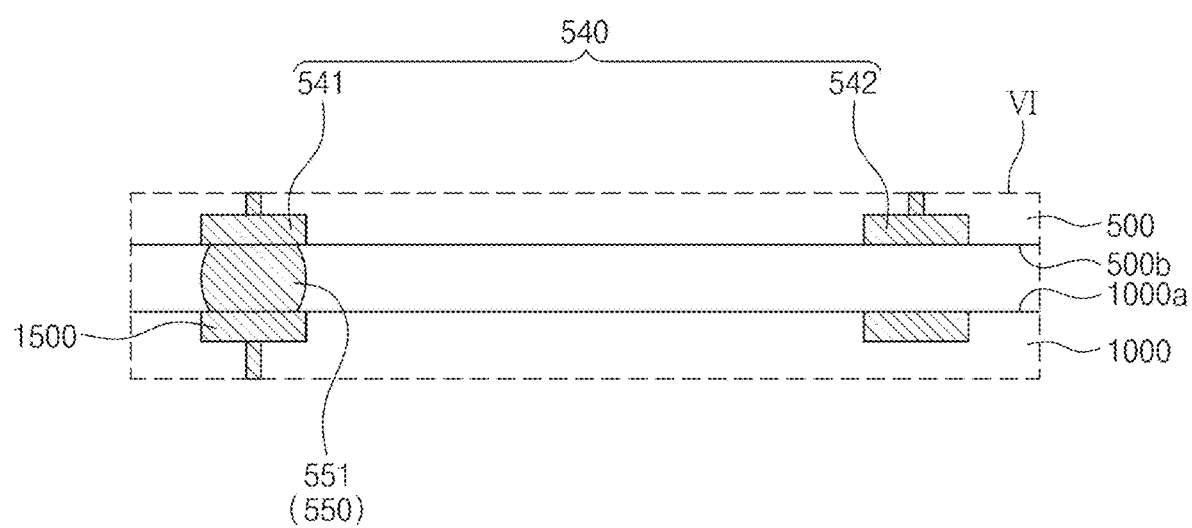
FIG. 5D illustrates a cross-sectional view showing lower pads according to some example embodiments.

FIG. 5A illustrates a cross-sectional view showing a semiconductor module according to some example embodiments. FIG. 5B illustrates an enlarged view of section C in FIG. 5A, showing a second passive device according to some example embodiments. FIG. 5C illustrates an enlarged view of section VI in FIG. 5A, showing lower pads and conductive terminals according to some example embodiments. FIG. 5D illustrates an enlarged view of section VI in FIG. 5A, showing lower pads according to some example embodiments.

Referring to FIGS. 1A, 5A, and 5B, a semiconductor module 10 may include a board 1000 and a package system 1. For example, a printed circuit board may be used as the board 1000. Conductive pads 1500 may be provided on a top surface 1000a of the board 1000. The conductive pads 1500 may be electrically connected to internal wiring lines of the board 1000.

The package system 1 discussed with reference to FIGS. 1A to 1C may be mounted on the board 1000, which may result in the formation of the semiconductor module 10. For another example, the semiconductor module 10 may be formed by mounting on the board 1000 one of the package system 1a of FIGS. 2A and 2B, the package system 1b of FIGS. 2C and 2D, the package system 1c of FIG. 2E, the package system 1d of FIG. 3A, the package system 1e of FIG. 3B, the package system 1f of FIG. 3C, the package system 1g of FIG. 3D, and the package system 1h of FIG. 4. For convenience of description, the following explains the semiconductor module 10 in which the package system 1 of FIGS. 1A to 1C is mounted on the board 1000, but inventive concepts are not limited thereto.

The mounting of the package system 1 may include providing the package system 1 on the board 1000 so as to cause the conductive terminals 550 to face the board 1000, and coupling the conductive terminals 550 to corresponding conductive pads 1500. The conductive terminals 550 may have a pitch substantially the same as a pitch P4 of the conductive pads 1500. The pitch P4 of the conductive pads 1500 may be standardized. For example, the pitch P4 of the conductive pads 1500 may meet Joint Electron Device Engineering Council (JEDEC) standard. The pitch P4 of the conductive pads 1500 may be relatively large. For example, the pitch P4 of the conductive pads 1500 may be equal to or greater than about 0.65 mm.

When the first semiconductor package 100, the second semiconductor package 200, and the third semiconductor package 300 are directly mounted on the board 1000, it may be required that each of a pitch P1 of the first connection terminals 150, a pitch P2 of the second connection terminals 250, and a pitch P3 of the third connection terminals 350 be substantially the same as the pitch P4 of the conductive pads 1500. In certain embodiments, the first, second, and third semiconductor packages 100, 200, and 300 may be coupled through the substrate 500 to the board 1000. Therefore, each of the pitch P1 of the first connection terminals 150, the pitch P2 of the second connection terminals 250, and the pitch P3 of the third connection terminals 350 may be freely designed without being restricted by the pitch P4 of the conductive pads 1500.

The pitch P1 of the first connection terminals 150 may be less than the pitch P4 of the conductive pads 1500. For example, the pitch P1 of the first connection terminals 150 may be equal to or less than about 0.4 mm. Thus, the first connection terminals 150 may be more densely provided to reduce a planar area of the first semiconductor package 100. Each of the pitch P2 of the second connection terminals 250 and the pitch P3 of the third connection terminals 350 may be less than the pitch P4 of the conductive pads 1500. For example, each of the pitch P2 of the second connection terminals 250 and the pitch P3 of the third connection terminals 350 may be equal to or less than about 0.4 mm. Thus, the second and third semiconductor packages 200 and 300 may become compact-sized. Because the first, second, and third semiconductor packages 100, 200, and 300 become compact-sized, distances between the first, second, and third semiconductor packages 100, 200, and 300 may become reduced. Therefore, it may be possible to decrease electrical path lengths between the first, second, and third semiconductor packages 100, 200, and 300. As a result, the package system 1 may increase in operating speed and reliability.

A fourth semiconductor package 800 may further be provided on a bottom surface 1000b of the board 1000. The fourth semiconductor package 800 may include a fourth package substrate 810, a fourth semiconductor chip 820, and a fourth molding layer 830. Fourth connection terminals 850 may be interposed between the board 1000 and the fourth semiconductor package 800. The fourth semiconductor package 800 may be electrically connected through the fourth connection terminals 850 to the board 1000. The fourth connection terminals 850 may include one or more of a solder ball, a bump, and a pillar. The fourth semiconductor package 800 mounted on the board 1000 may have a height H5 that is defined to include a height of the fourth connection terminal 850. For example, the height H5 of the mounted fourth semiconductor package 800 may be the same as a sum of heights of the fourth connection terminal 850, the fourth package substrate 810, and the fourth molding layer 830. The height H5 of the mounted fourth semiconductor package 800 may be greater than the height H1 of the mounted first semiconductor package 100. Even though the height H5 of the mounted fourth semiconductor package 800 is great, the fourth semiconductor package 800 may be electrically connected through the board 1000 to the package system 1.

The fourth semiconductor package 800 may be electrically connected to one of the first semiconductor package 100, the second semiconductor package 200, the third semiconductor package 300, and the first passive device 400. The fourth semiconductor package 800 may overlap or be adjacent to the one of the first semiconductor package 100, the second semiconductor package 200, the third semiconductor package 300, and the first passive device 400. Therefore, it may be possible to reduce a signal path length between the fourth semiconductor package 800 and the one of the first semiconductor package 100, the second semiconductor package 200, the third semiconductor package 300, and the first passive device 400. The fourth semiconductor package 800 may be provided in plural. In this case, the heights H4 of the fourth semiconductor packages 800 may be the same as each other or different from each other.

A second passive device 420 may be mounted on the bottom surface 1000b of the board 1000. Second connectors 412 may further be provided between the board 1000 and the second passive device 420. The second passive device 420 may be coupled through the second connectors 412 to the board 1000. The second connectors 412 may include a soldering material. The second passive device 420 mounted on the board 1000 may have a height H6 that is defined to include a height H61 of the second connector 412. For example, the height H4 of the mounted second passive device 420 may be the same as a sum of the height H61 of the second connector 412 and a height H60 of the second passive device 420' before mounted on the board 1000. The height H6 of the mounted second passive device 420 may be greater than the sum of the height H1 of the mounted first semiconductor package 100 and the height A1 of the first thermal conductive layer 710. Even though the height H6 of the mounted second passive device 420 is great, the second passive device 420 may be electrically connected through the board 1000 to the package system 1.

The second passive device 420 may be electrically connected to one of the first, second, and third semiconductor packages 100, 200, and 300. When viewed in plan, the second passive device 420 may overlap or be adjacent to the one of the first, second, and third semiconductor packages 100, 200, and 300. Therefore, it may be possible to decrease an electrical path length between the second passive device 420 and the one of the first, second, and third semiconductor packages 100, 200, and 300. The second passive device 420 may be provided in plural. In this case, the heights H6 of the second passive devices 420 may be the same as each other or different from each other. The following will describe the conductive terminals 550 and lower pads 540 with reference to FIGS. 5C and 5D.

Referring to FIGS. 5A to 5C, the lower pads 540 may be provided on a bottom surface 500b of the substrate 500. The lower pads 540 may include a connection pad 541 and a test pad 542. During the fabrication of the package system 1 or prior to the mounting of the package system 1 on the board 1000, a process may be performed to evaluate electrical characteristics of the package system 1. The test pad 542 may be used to evaluate electrical characteristics of the package system 1. For example, a probe (not shown) may contact the test pad 542 to evaluate electrical characteristics of one or more of the first semiconductor package 100, the second semiconductor package 200, the third semiconductor package 300, the first passive device 400, and the electronic device 430. After that, the conductive terminals 550 may be formed, and the package system 1 may be mounted on the board 1000.

As shown in FIG. 5C, the conductive terminals 550 may be provided on corresponding bottom surfaces of the lower pads 540. The conductive terminal 550 may include a first terminal 551 and a second terminal 552. The first terminal 551 may be coupled to the connection pad 541. The first terminal 551 may electrically connect the board 1000 to one or more of the first, second, and third semiconductor packages 100, 200, and 300. The first terminal 551 may serve as a signal pathway.

The second terminal 552 may be coupled to the test pad 542. For example, the second terminal 552 may serve as a ground terminal and may be supplied with a ground voltage. The test pad 542 may be provided as a supply pathway for the ground voltage. For another example, the second terminal 552 may serve as dummy terminal and may not be electrically connected to the conductive pad 1500.

As shown in FIG. 5D, the second terminal 552 may not be provided. The test pad 542 may not be physically and electrically connected to the board 1000. Although not shown, an under-fill material may further be provided to fill a gap between the board 1000 and the test pad 542. The under-fill material may include a dielectric polymer.

According to inventive concepts, the first thermal conductive layer may be provided on the first semiconductor package. The trench may, when viewed in plan, overlap one or more of the second and third semiconductor packages. Therefore, the first thermal conductive layer may have a height less than those of the second and third thermal conductive layers. The more reduced is the height of the first thermal conductive layer, the more improved are thermal characteristics of the first semiconductor package. The improvement in thermal characteristics of the first semiconductor package may lead to enhancement in thermal characteristics of the package system.

This detailed description of inventive concepts should not be construed as limited to the embodiments set forth herein, and it is intended that inventive concepts cover the various combinations, the modifications and variations without departing from the spirit and scope of inventive concepts.

What is claimed is:

1. A semiconductor package system, comprising:
a board;
a lower passive device on a lower surface of the board;
a substrate on an upper surface of the board;
a plurality of conductive terminals between the substrate and the board;
a first semiconductor package on a top surface of the substrate and including a first substrate and a first semiconductor chip, the first semiconductor chip including logic circuits;
a first thermal conductive layer on the first semiconductor package;
an upper passive device on the top surface of the substrate; and
a heat radiation structure on the first thermal conductive layer and the upper passive device, wherein the heat radiation structure has:
a first bottom surface physically contacting the first thermal conductive layer; and
a second bottom surface disposed at a higher level than the first bottom surface and vertically overlapping the upper passive device;
wherein a height of the upper passive device is equal to or greater than a sum of a first height of the first semiconductor package and a first thickness of the first thermal conductive layer, and
wherein a height of the lower passive device is greater than the sum of the first height and the first thickness.

2. The semiconductor package system of claim 1, further comprising a lower semiconductor package disposed on the lower surface of the board and spaced apart from the lower passive device,
wherein a height of the lower semiconductor package is greater than the first height.

3. The semiconductor package system of claim 2, wherein the lower semiconductor package is electrically connected to the first semiconductor package through the board and the substrate, and
wherein the lower semiconductor package vertically overlaps the first semiconductor package.

4. The semiconductor package system of claim 2, wherein the lower semiconductor package includes a lower package substrate and a lower semiconductor chip mounted on the lower package substrate.

5. The semiconductor package system of claim 1, further comprising:
a second semiconductor package mounted on the top surface of the substrate and including a second substrate, a second semiconductor chip, and a second molding layer,
wherein the second semiconductor chip includes a power management chip or a memory chip.

6. The semiconductor package system of claim 5, further comprising:
a second thermal conductive layer between the second semiconductor package and the heat radiation structure,
wherein the first thickness is less than a thickness of the second thermal conductive layer.

7. The semiconductor package system of claim 5, further comprising:
an underfill layer provided between the substrate and the second semiconductor package; and
a dam structure on the top surface of substrate,
wherein the dam structure is disposed between the underfill layer and the upper passive device.

8. The semiconductor package system of claim 1, further comprising:
a thermal interface layer between the upper passive device and the second bottom surface of the heat radiation structure.

9. The semiconductor package system of claim 8, wherein the first thickness is smaller than a thickness of the thermal interface layer.

10. The semiconductor package system of claim 1, further comprising:
solder terminals between the substrate and the first semiconductor package,
wherein a pitch of the solder terminals is less than a pitch of the plurality of conductive terminals.

11. A semiconductor package system, comprising:
a substrate;
a first semiconductor package provided on a top surface of the substrate, the first semiconductor package including a first substrate and a first semiconductor chip, the first semiconductor chip including logic circuits;
a first thermal conductive layer on the first semiconductor package;
a passive device disposed on the top surface of the substrate and spaced apart from the first semiconductor package;
a thermal interface layer on the passive device; and
a heat radiation structure on the first thermal conductive layer and the thermal interface layer,
wherein the heat radiation structure has:
a first bottom surface physically contacting the first thermal conductive layer; and
a second bottom surface disposed at a higher level than the first bottom surface and physically contacting the thermal interface layer.

12. The semiconductor package system of claim 11, wherein a height of the passive device is the same as or greater than a first height of the first semiconductor package, and
wherein a first thickness of the first thermal conductive layer is less than a thickness of the thermal interface layer.

13. The semiconductor package system of claim 12, further comprising:
- a ground pattern disposed on the top surface of the substrate and configured to be supplied with a ground voltage; and
- a conductive adhesive pattern between the ground pattern and the heat radiation structure,
- wherein the first thickness is less than a thickness of the conductive adhesive pattern.

14. The semiconductor package system of claim 13, wherein the heat radiation structure is electrically connected through the conductive adhesive pattern to the ground pattern.

15. The semiconductor package system of claim 12, further comprising:
- a second semiconductor package mounted on the top surface of the substrate and including a second substrate and a second semiconductor chip; and
- a third semiconductor package mounted on the top surface of the substrate and including a third substrate and a third semiconductor chip,
- wherein the second semiconductor chip includes a memory chip, and
- wherein the third semiconductor chip includes a power management chip.

16. The semiconductor package system of claim 15, further comprising:
- a second thermal conductive layer between the second semiconductor package and the heat radiation structure; and
- a third thermal conductive layer between the third semiconductor package and the heat radiation structure,
- wherein the first thickness is less than each of a thickness of the second thermal conductive layer and a thickness of the third thermal conductive layer.

17. The semiconductor package system of claim 11, further comprising:
- a board on a lower surface of the substrate;
- a plurality of conductive terminals between the substrate and the board; and
- solder terminals between the substrate and the first semiconductor package,
- wherein a pitch of the solder terminals is less than a pitch of the plurality of conductive terminals.

18. A semiconductor package system, comprising:
- a board;
- a lower passive device on a lower surface of the board;
- a substrate on an upper surface of the board;
- a plurality of conductive terminals between the substrate and the board;
- a first semiconductor package on a top surface of the substrate, the first semiconductor package including a first substrate and a first semiconductor chip, the first semiconductor chip including logic circuits;
- first solder terminals disposed between the substrate and the first semiconductor package and electrically connected to the substrate and the first semiconductor package;
- a first thermal conductive layer on the first semiconductor package;
- a second semiconductor package mounted on the top surface of the substrate and including a second substrate and a second semiconductor chip;
- second solder terminals disposed between the substrate and the second semiconductor package;
- a third semiconductor package mounted on the top surface of the substrate and including a third substrate and a third semiconductor chip;
- third solder terminals between the substrate and the third semiconductor package;
- an upper passive device on the top surface of the substrate and spaced apart from the first, second, and third semiconductor packages; and
- a heat radiation structure on the first thermal conductive layer, the second semiconductor package, the third semiconductor package and the upper passive device,
- wherein the heat radiation structure has:
- a first bottom surface physically contacting the first thermal conductive layer; and
- a second bottom surface disposed at a higher level than the first bottom surface and vertically overlapping the upper passive device;
- wherein a height of the upper passive device is equal to or greater than a sum of a first height of the first semiconductor package and a first thickness of the first thermal conductive layer, and
- wherein a height of the lower passive device is greater than the sum of the first height and the first thickness.

19. The semiconductor package system of claim 18, further comprising a lower semiconductor package disposed on the lower surface of the board and including a lower package substrate and a lower semiconductor chip,
- wherein a height of the lower semiconductor package is greater than the first height.

20. The semiconductor package system of claim 18, wherein each of a pitch of the first solder terminals, a pitch of the second solder terminals, and a pitch of the third solder terminals is less than a pitch of the plurality of conductive terminals.

* * * * *